US006892270B2

United States Patent
Roohparvar

(10) Patent No.: US 6,892,270 B2
(45) Date of Patent: May 10, 2005

(54) SYNCHRONOUS FLASH MEMORY EMULATING THE PIN CONFIGURATION OF SDRAM

(75) Inventor: Frankie F. Roohparvar, Milpitas, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/786,353

(22) Filed: Feb. 25, 2004

(65) Prior Publication Data

US 2004/0165447 A1 Aug. 26, 2004

Related U.S. Application Data

(62) Division of application No. 09/627,682, filed on Jul. 28, 2000.

(51) Int. Cl.⁷ .......................................... H01L 21/8242
(52) U.S. Cl. ...................................... 711/105; 711/101
(58) Field of Search ................................ 711/105, 104, 711/166, 101; 326/101; 365/189.01, 193, 226, 233; 712/224; 713/300, 400

(56) References Cited

U.S. PATENT DOCUMENTS

| | | | |
|---|---|---|---|
| 5,041,886 A | 8/1991 | Lee | |
| 5,440,632 A | 8/1995 | Bacon | |
| 5,537,354 A | 7/1996 | Mochizuki et al. | |
| 5,586,081 A | 12/1996 | Mills et al. | |
| 5,600,605 A | 2/1997 | Schaefer | |
| 5,666,321 A | 9/1997 | Schaefer | |
| 5,696,917 A | 12/1997 | Mills et al. | |
| 5,751,039 A | 5/1998 | Kauffman et al. | |
| 5,754,838 A | 5/1998 | Shibata et al. | |
| 5,787,457 A | 7/1998 | Miller et al. | |
| 5,822,256 A | 10/1998 | Bauer et al. | |
| 5,936,903 A | 8/1999 | Jeng et al. | |
| 5,986,943 A | 11/1999 | Isa | |
| 5,995,438 A | 11/1999 | Jeng et al. | |
| 6,026,465 A | 2/2000 | Mills et al. | |
| 6,137,133 A | 10/2000 | Kauffman et al. | |
| 6,141,247 A | 10/2000 | Roohparvar et al. | |
| 6,266,282 B1 | 7/2001 | Hwang et al. | |
| 6,314,049 B1 * | 11/2001 | Roohparvar | 365/233 |

(Continued)

OTHER PUBLICATIONS

Keeth, et al., "DRAM circuit design: a tutorial," IEEE Press, 2001, pp. 16–23, 142–153.
Micron Semiconductor Products, Inc., "2Mb, Smart 5 BIOS–Optimized Boot Block Flash Memory," *Flash Memory* www.micron.com, copyright 2000, Micron Technology, Inc., pp. 1–12.
Micron, "16 Mb: xSDRAM" *Synchronous DRAM*, www.micron.com, copyright 1999 Micron Technology, Inc., pp. 1–51.

Primary Examiner—B. James Peikari
(74) Attorney, Agent, or Firm—Leffert Jay & Polglaze PA

(57) ABSTRACT

A computer system comprises a memory controller and a synchronous non-volatile memory device coupled to the memory controller via a main memory bus. The synchronous non-volatile memory device has external interconnects arranged in a manner that corresponds to interconnects of a synchronous dynamic random access memory device. The synchronous flash memory device, however, comprises a reset connection, and a Vccp power supply connection correspond to first and second no-connect (NC) interconnect pins of the synchronous dynamic random access memory. In one embodiment, the synchronous non-volatile memory device has a command interface comprising a write enable connection (WE#) to receive a write enable signal, a column address strobe connection (CAS#) to receive a column address strobe signal, a row address strobe connection (RAS#) to receive a row address strobe signal, and a chip select connection (CS#) to receive a chip select signal.

20 Claims, 36 Drawing Sheets

U.S. PATENT DOCUMENTS

| | | | |
|---|---|---|---|
| 6,442,076 B1 * | 8/2002 | Roohparvar | 365/185.33 |
| 6,615,307 B1 * | 9/2003 | Roohparvar | 711/103 |
| 6,654,847 B1 * | 11/2003 | Roohparvar et al. | 711/103 |
| 6,675,255 B1 * | 1/2004 | Roohparvar | 711/103 |
| 6,697,907 B1 * | 2/2004 | Roohparvar | 711/103 |
| 6,728,161 B1 * | 4/2004 | Roohparvar | 365/233 |
| 6,785,764 B1 * | 8/2004 | Roohparvar | 711/103 |

* cited by examiner

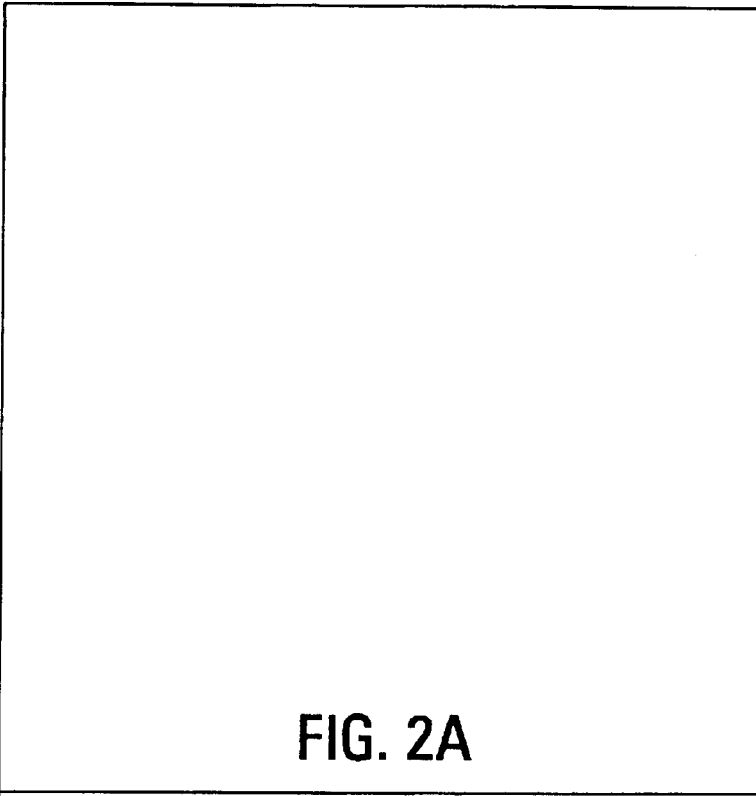
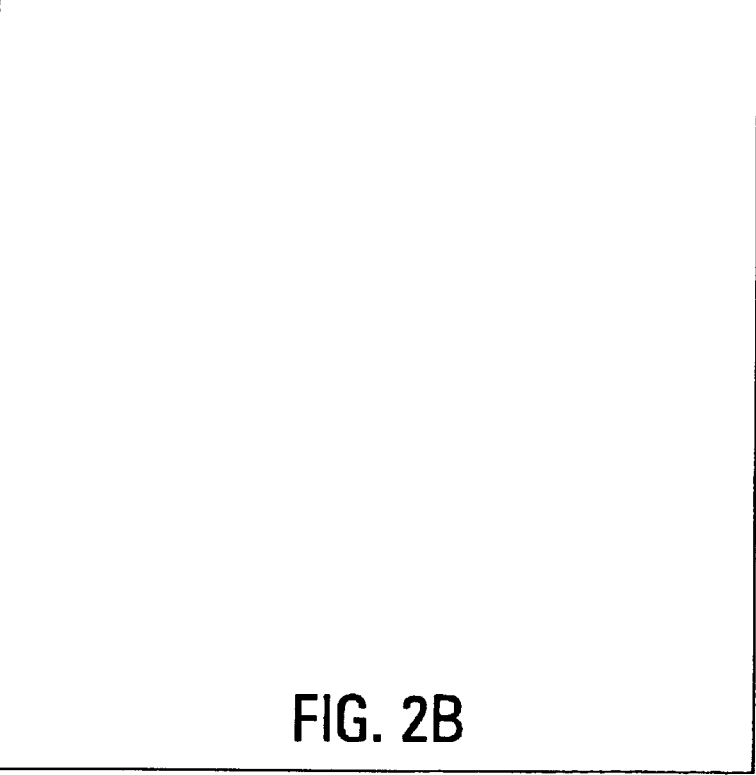
FIG. 2

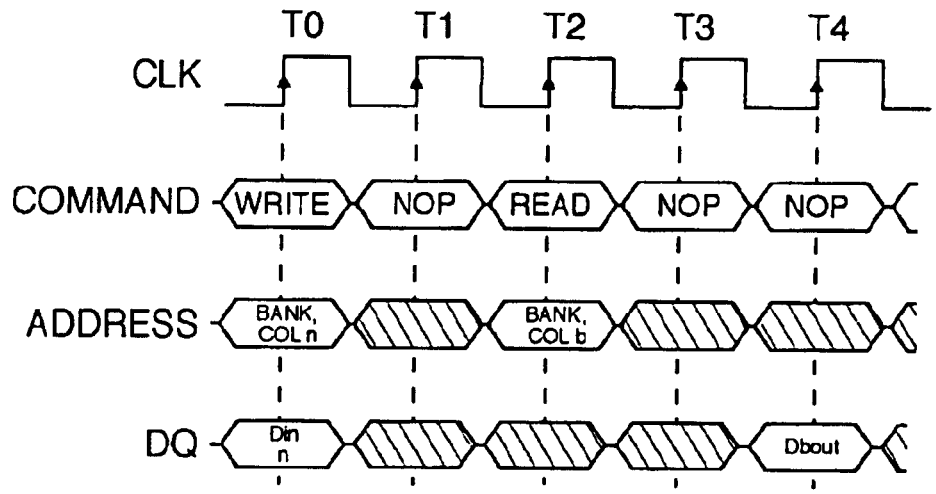
NOTE: A CAS latency of two is used for illustration. The WRITE command may be to any bank and the READ command may be to any bank. DQM is LOW . A READ to the bank undergoing the WRITE ISM operation may output invalid data.
 DON'T CARE
FIG. 12

ADDRESS RANGE

| Bank | Bank | Row | Column | Block | |
|---|---|---|---|---|---|
| Bank 3 | 3 | FFF | FFH | 256K-Word Block | 15 |
|  | 3 | C00 | 00H |  |  |
|  | 3 | BFF | FFH | 256K-Word Block | 14 |
|  | 3 | 800 | 00H |  |  |
|  | 3 | 7FF | FFH | 256K-Word Block | 13 |
|  | 3 | 400 | 00H |  |  |
|  | 3 | 3FF | FFH | 256K-Word Block | 12 |
|  | 3 | 000 | 00H |  |  |
| Bank 2 | 2 | FFF | FFH | 256K-Word Block | 11 |
|  | 2 | C00 | 00H |  |  |
|  | 2 | BFF | FFH | 256K-Word Block | 10 |
|  | 2 | 800 | 00H |  |  |
|  | 2 | 7FF | FFH | 256K-Word Block | 9 |
|  | 2 | 400 | 00H |  |  |
|  | 2 | 3FF | FFH | 256K-Word Block | 8 |
|  | 2 | 000 | 00H |  |  |
| Bank 1 | 1 | FFF | FFH | 256K-Word Block | 7 |
|  | 1 | C00 | 00H |  |  |
|  | 1 | BFF | FFH | 256K-Word Block | 6 |
|  | 1 | 800 | 00H |  |  |
|  | 1 | 7FF | FFH | 256K-Word Block | 5 |
|  | 1 | 400 | 00H |  |  |
|  | 1 | 3FF | FFH | 256K-Word Block | 4 |
|  | 1 | 000 | 00H |  |  |
| Bank 0 | 0 | FFF | FFH | 256K-Word Block | 3 |
|  | 0 | C00 | 00H |  |  |
|  | 0 | BFF | FFH | 256K-Word Block | 2 |
|  | 0 | 800 | 00H |  |  |
|  | 0 | 7FF | FFH | 256K-Word Block | 1 |
|  | 0 | 400 | 00H |  |  |
|  | 0 | 3FF | FFH | 256K-Word Block | 0 |
|  | 0 | 000 | 00H |  |  |

Block 15 marked as 210; Block 0 marked as 220.

Word-wide (x16)

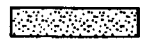 Software Lock = Hardware-Lock Sectors
RP# = $V_{HH}$ to unprotect if either the
block protect or device protect bit is set.

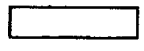 Software Lock = Hardware-Lock Sectors
RP# = Vcc to unprotect but must be $V_{HH}$
if the device protect bit is set.

See BLOCK PROTECT/UNPROTECT SEQUENCE for detailed information.

FIG. 15

SYNCHRONOUS FLASH MEMORY EMULATING THE PIN CONFIGURATION OF SDRAM

RELATED APPLICATION

This Application is a Divisional of U.S. application Ser. No. 09/627,682 filed Jul. 28, 2000, which is incorporated herein by reference.

TECHNICAL FIELD OF THE INVENTION

The present invention relates generally to non-volatile memory devices and in particular the present invention relates to a synchronous non-volatile flash memory.

BACKGROUND OF THE INVENTION

Memory devices are typically provided as internal storage areas in the computer. The term memory identifies data storage that comes in the form of integrated circuit chips. There are several different types of memory. One type is RAM (random-access memory). This is typically used as main memory in a computer environment. RAM refers to read and write memory; that is, you can both write data into RAM and read data from RAM. This is in contrast to ROM, which permits you only to read data. Most RAM is volatile, which means that it requires a steady flow of electricity to maintain its contents. As soon as the power is turned off, whatever data was in RAM is lost.

Computers almost always contain a small amount of read-only memory (ROM) that holds instructions for starting up the computer. Unlike RAM, ROM cannot be written to. An EEPROM (electrically erasable programmable read-only memory) is a special type non-volatile ROM that can be erased by exposing it to an electrical charge. Like other types of ROM, EEPROM is traditionally not as fast as RAM. EEPROM comprise a large number of memory cells having electrically isolated gates (floating gates). Data is stored in the memory cells in the form of charge on the floating gates. Charge is transported to or removed from the floating gates by programming and erase operations, respectively.

Yet another type of non-volatile memory is a Flash memory. A Flash memory is a type of EEPROM that can be erased and reprogrammed in blocks instead of one byte at a time. Many modem PCS have their BIOS stored on a flash memory chip so that it can easily be updated if necessary. Such a BIOS is sometimes called a flash BIOS. Flash memory is also popular in modems because it enables the modem manufacturer to support new protocols as they become standardized.

A typical Flash memory comprises a memory array which includes a large number of memory cells arranged in row and column fashion. Each of the memory cells includes a floating gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

A synchronous DRAM (SDRAM) is a type of DRAM that can run at much higher clock speeds than conventional DRAM memory. SDRAM synchronizes itself with a CPU's bus and is capable of running at 100 MHZ, about three times faster than conventional FPM (Fast Page Mode) RAM, and about twice as fast EDO (Extended Data Output) DRAM and BEDO (Burst Extended Data Output) DRAM. SDRAM's can be accessed quickly, but are volatile. Many computer systems are designed to operate using SDRAM, but would benefit from non-volatile memory.

For the reasons stated above, and for other reasons stated below which will become apparent to those skilled in the art upon reading and understanding the present specification, there is a need in the art for a non-volatile memory device that can operate in a manner similar to SDRAM operation.

SUMMARY OF THE INVENTION

The above-mentioned problems with memory devices and other problems are addressed by the present invention and will be understood by reading and studying the following specification.

In one embodiment, the present invention provides a non-volatile synchronous flash memory that is compatible with existing SDRAM package pin assignments. It will be apparent from reading the detailed description that system designers with knowledge in SDRAM applications could easily implement the present invention to improve system operation.

In one embodiment, a computer system comprises a memory controller, a main memory bus coupled to the memory controller, and a synchronous non-volatile memory device coupled to the main memory bus.

In another embodiment, a synchronous flash memory device comprises an array of non-volatile memory cells, and a package having a plurality of interconnects arranged in a manner that corresponds to interconnect pins of a synchronous dynamic random access memory device. The plurality of interconnects of the synchronous flash memory device comprises a reset connection, and a Vccp power supply connection correspond to first and second no-connect (NC) interconnect pins of the synchronous dynamic random access memory.

In yet another embodiment, a computer system comprises a memory controller, a main memory bus coupled to the memory controller, and a synchronous non-volatile flash memory device coupled to the main memory bus. The synchronous non-volatile flash memory device has a command interface comprising a write enable connection (WE#) to receive a write enable signal, a column address strobe connection (CAS#) to receive a column address strobe signal, a row address strobe connection (RAS#) to receive a row address strobe signal, and a chip select connection (CS#) to receive a chip select signal.

BRIEF DESCRIPTION OF THE DRAWINGS

FIG. 12 illustrates a write followed by a read operation;

FIG. 15 illustrates a memory address map of one embodiment of the memory having two boot sectors;

DETAILED DESCRIPTION OF THE INVENTION

In the following detailed description of present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

The following detailed description is divided into two major sections. The first section is an Interface Functional Description that details compatibility with an SDRAM memory. The second major section is a Functional Description that specifies flash architecture functional commands.

Interface Functional Description

Figure 1A:
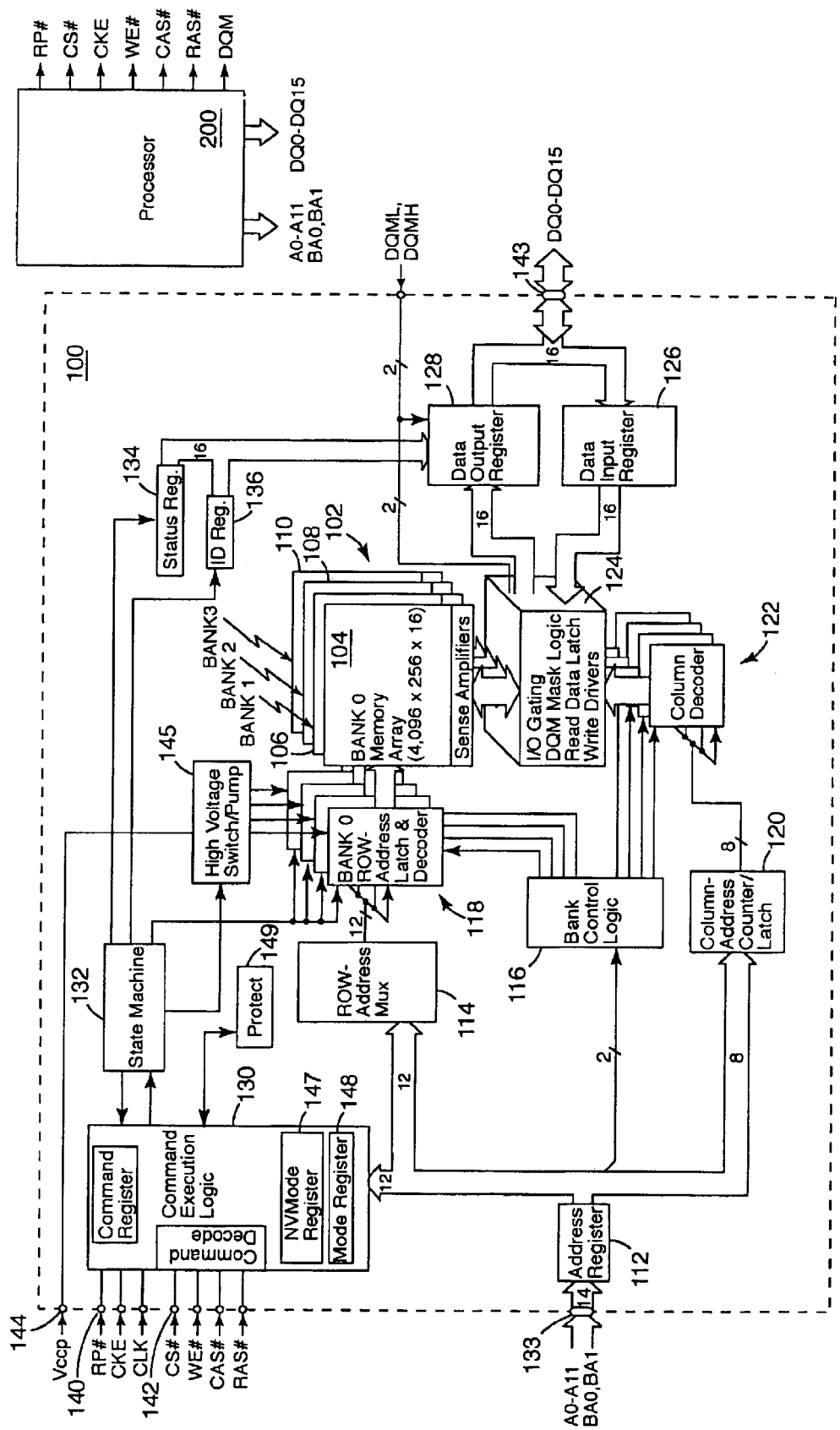
FIG. 1A is a block diagram of a synchronous flash memory of the present invention.

Referring to FIG. 1A, a block diagram of one embodiment of the present invention is described. The memory device 100 includes an array of non-volatile flash memory cells 102. The array is arranged in a plurality of addressable banks. In one embodiment, the memory contains four memory banks 104, 106, 108 and 110. Each memory bank contains addressable sectors of memory cells. The data stored in the memory can be accessed using externally provided location addresses received by address register 112. The addresses are decoded using row address multiplexer circuitry 114. The addresses are also decoded using bank control logic 116 and row address latch and decode circuitry 118. To access an appropriate column of the memory, column address counter and latch circuitry 120 couples the received addresses to column decode circuitry 122. Circuit 124 provides input/output gating, data mask logic, read data latch circuitry and write driver circuitry. Data is input through data input registers 126 and output through data output registers 128. Command execution logic 130 is provided to control the basic operations of the memory device. A state machine 132 is also provided to control specific operations performed on the memory arrays and cells. A status register 134 and an identification register 136 can also be provided to output data. The command circuit 130 and/or state machine 132 can be generally referred to as control circuitry to control read, write, erase and other memory operations.

Figure 1B:
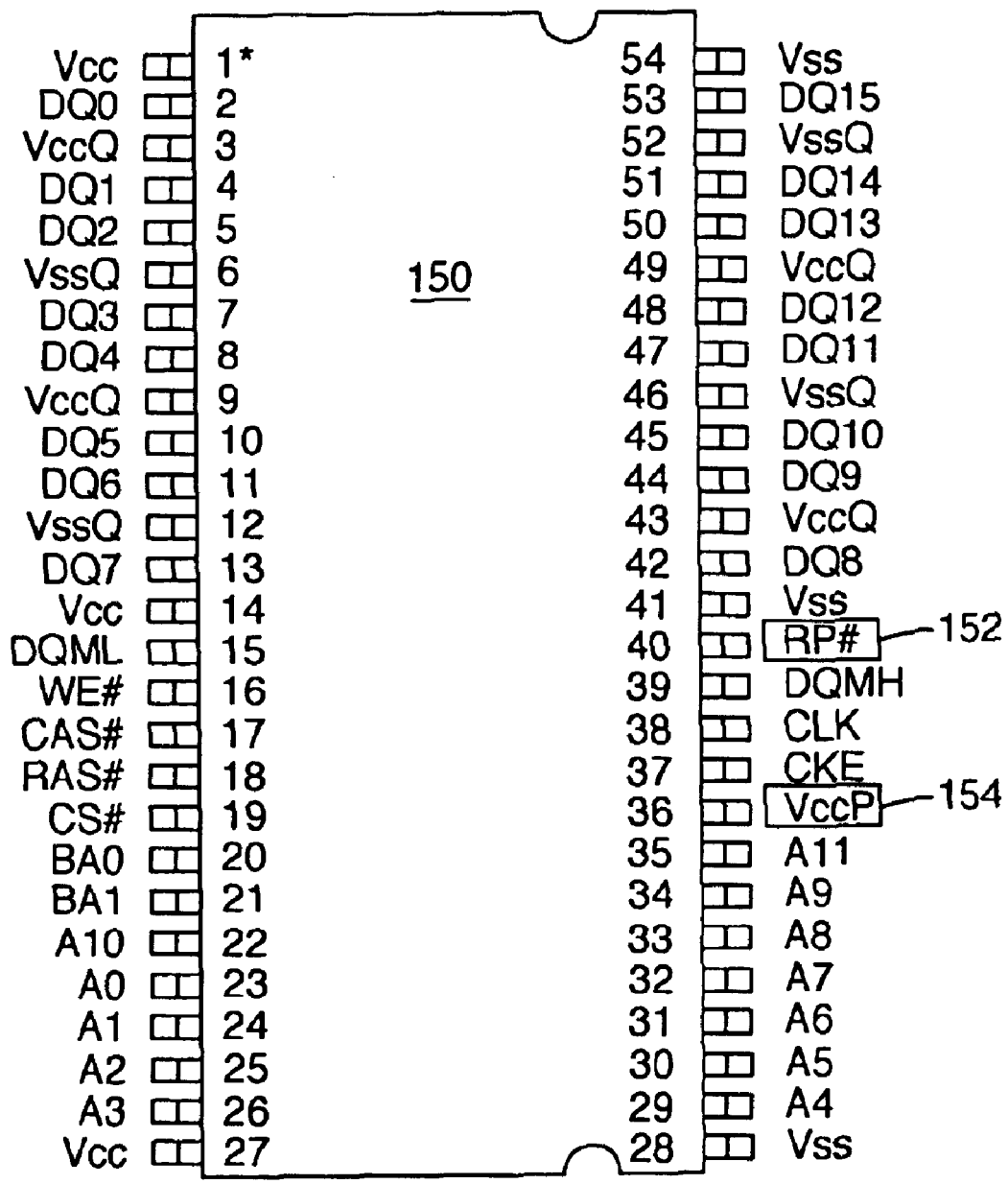
FIG. 1B is an integrated circuit pin interconnect diagram of one embodiment of the present invention.
Figure 1C:
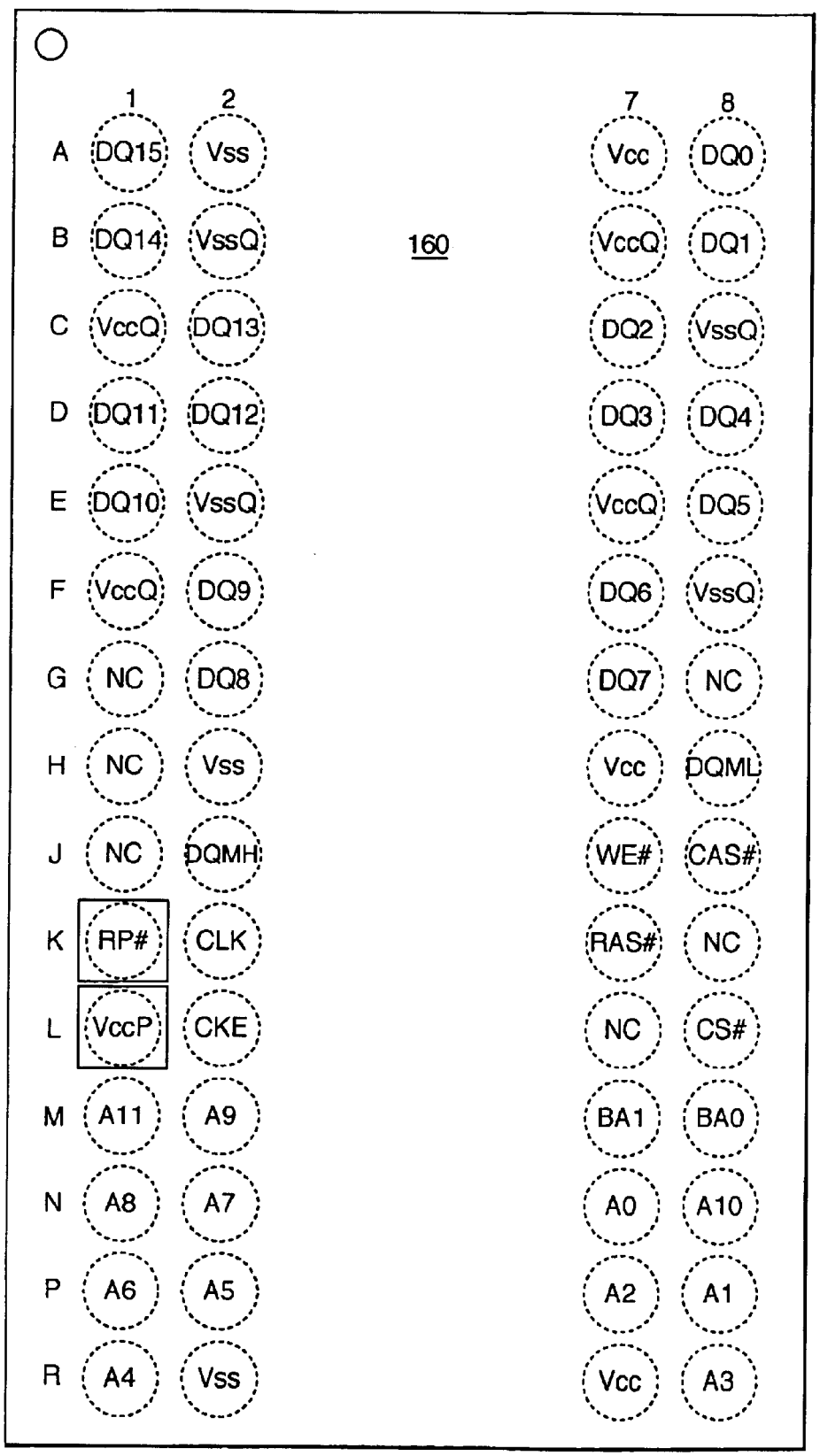
FIG. 1C is an integrated circuit interconnect bump grid array diagram of one embodiment of the present invention.

FIG. 1B illustrates an interconnect pin assignment of one embodiment of the present invention. The memory package 150 has 54 interconnect pins. The pin configuration is substantially similar to available SDRAM packages. Two interconnects specific to the present invention are RP# 152 and Vccp 154. Although the present invention may share interconnect labels that appear the same as SDRAM's, the function of the signals provided on the interconnects are described herein and should not be equated to SDRAM's unless set forth herein. FIG. 1C illustrates one embodiment of a memory package 160 that has solder bump connections instead of the pin connections of FIG. 1C. The present invention, therefore, is not limited to a specific package configuration.

Prior to describing the operational features of the memory device, a more detailed description of the interconnect pins and their respective signals is provided.

The input clock connection is used to provide a clock signal (CLK). The clock signal can be driven by a system clock, and all synchronous flash memory input signals are sampled on the positive edge of CLK. CLK also increments an internal burst counter and controls the output registers.

The input clock enable (CKE) connection is used to activate (HIGH state) and deactivates (LOW state) the CLK signal input. Deactivating the clock input provides POWER-DOWN and STANDBY operation (where all memory banks are idle), ACTIVE POWER-DOWN (a memory row is ACTIVE in either bank) or CLOCK SUSPEND operation (burst/access in progress). CKE is synchronous except after the device enters power-down modes, where CKE becomes asynchronous until after exiting the same mode. The input buffers, including CLK, are disabled during power-down modes to provide low standby power. CKE may be tied HIGH in systems where power-down modes (other than RP# deep power-down) are not required.

The chip select (CS#) input connection provides a signal to enable (registered LOW) and disable (registered HIGH) a command decoder provided in the command execution logic. All commands are masked when CS# is registered HIGH. Further, CS# provides for external bank selection on systems with multiple banks, and CS# can be considered part of the command code; but may not be necessary.

The input command input connections for RAS#, CAS#, and WE# (along with CAS#, CS#) define a command that is to be executed by the memory, as described in detail below. The input/output mask (DQM) connections are used to provide input mask signals for write accesses and an output enable signal for read accesses. Input data is masked when DQM is sampled HIGH during a WRITE cycle. The output buffers are placed in a high impedance (High-Z) state (after a two-clock latency) when DQM is sampled HIGH during a READ cycle. DQML corresponds to data connections DQ0–DQ7 and DQMH corresponds to data connections DQ8–DQ15. DQML and DQMH are considered to be the same state when referenced as DQM.

Address inputs 133 are primarily used to provide address signals. In the illustrated embodiment the memory has 12 lines (A0–A11). Other signals can be provided on the address connections, as described below. The address inputs are sampled during an ACTIVE command (row-address A0–A11) and a READ/WRITE command (column-address A0–A7) to select one location in a respective memory bank. The address inputs are also used to provide an operating code (OpCode) during a LOAD COMMAND REGISTER operation, explained below. Address lines A0–A11 are also used to input mode settings during a LOAD MODE REGISTER operation.

An input reset/power-down (RP#) connection 140 is used for reset and power-down operations. Upon initial device power-up, a 100 µs delay after RP# has transitioned from LOW to HIGH is required in one embodiment for internal device initialization, prior to issuing an executable command. The RP# signal clears the status register, sets the internal state machine (ISM) 132 to an array read mode, and places the device in a deep power-down mode when LOW. During power down, all input connections, including CS# 142, are "Don't Care" and all outputs are placed in a High-Z state. When the RP# signal is equal to a VHH voltage (5V), all protection modes are ignored during WRITE and ERASE. The RP# signal also allows a device protect bit to be set to 1 (protected) and allows block protect bits of a 16 bit register 149, at locations 0 and 15 to be set to 0 (unprotected) when brought to VHH. The protect bits are described in more detail below. RP# is held HIGH during all other modes of operation.

Bank address input connections, BA0 and BA1 define which bank an ACTIVE, READ, WRITE, or BLOCK PROTECT command is being applied. The DQ0–DQ15 connections 143 are data bus connections used for bi-directional data communication. Referring to FIG. 1B, a VCCQ connection is used to provide isolated power to the DQ connections to improved noise immunity. In one embodiment, VCCQ=Vcc or 1.8V±0.15V. The VSSQ connection is used to isolated ground to DQs for improved noise immunity. The VCC connection provides a power supply, such as 3V. A ground connection is provided through the Vss connection. Another optional voltage is provided on the VCCP connection 144. The VCCP connection can be tied externally to VCC, and sources current during device initialization, WRITE and ERASE operations. That is, writing or erasing to the memory device can be performed using a VCCP voltage, while all other operations can be performed with a VCC voltage. The Vccp connection is coupled to a high voltage switch/pump circuit 145.

The following sections provide a more detailed description of the operation of the synchronous flash memory. One embodiment of the present invention is a nonvolatile, electrically sector-erasable (Flash), programmable read-only memory containing 67,108,864 bits organized as 4,194,304 words by 16 bits. Other population densities are contemplated, and the present invention is not limited to the example density. Each memory bank is organized into four independently erasable blocks (16 total). To ensure that critical firmware is protected from accidental erasure or overwrite, the memory can include sixteen 256K-word hardware and software lockable blocks. The memory's four-bank architecture supports true concurrent operations.

A read access to any bank can occur simultaneously with a background WRITE or ERASE operation to any other bank. The synchronous flash memory has a synchronous interface (all signals are registered on the positive edge of the clock signal, CLK). Read accesses to the memory can be burst oriented. That is, memory accesses start at a selected location and continue for a programmed number of locations in a programmed sequence. Read accesses begin with the registration of an ACTIVE command, followed by a READ command. The address bits registered coincident with the ACTIVE command are used to select the bank and row to be accessed. The address bits registered coincident with the READ command are used to select the starting column location and bank for the burst access.

The synchronous flash memory provides for programmable read burst lengths of 1, 2, 4 or 8 locations, or the full page, with a burst terminate option. Further, the synchronous flash memory uses an internal pipelined architecture to achieve high-speed operation.

The synchronous flash memory can operate in low-power memory systems, such as systems operating on three volts. A deep power-down mode is provided, along with a power-saving standby mode. All inputs and outputs are low voltage transistor-transistor logic (LVTTL) compatible. The synchronous flash memory offers substantial advances in Flash operating performance, including the ability to synchronously burst data at a high data rate with automatic column address generation and the capability to randomly change column addresses on each clock cycle during a burst access.

In general, the synchronous flash memory is configured similar to a multi-bank DRAM that operates at low voltage and includes a synchronous interface. Each of the banks is organized into rows and columns. Prior to normal operation, the synchronous flash memory is initialized. The following sections provide detailed information covering device initialization, register definition, command descriptions and device operation.

The synchronous flash is powered up and initialized in a predefined manner. After power is applied to VCC, VCCQ and VCCP (simultaneously), and the clock signal is stable, RP# 140 is brought from a LOW state to a HIGH state. A delay, such as a 100 μs is delay, is needed after RP# transitions HIGH in order to complete internal device initialization. After the delay time has passed, the memory is placed in an array read mode and is ready for Mode Register programming or an executable command. After initial programming of a non-volatile mode register 147 (NVMode Register), the contents are automatically loaded into a volatile Mode Register 148 during the initialization. The device will power up in a programmed state and will not require reloading of the non-volatile mode register 147 prior to issuing operational commands. This is explained in greater detail below.

Figure 2A:
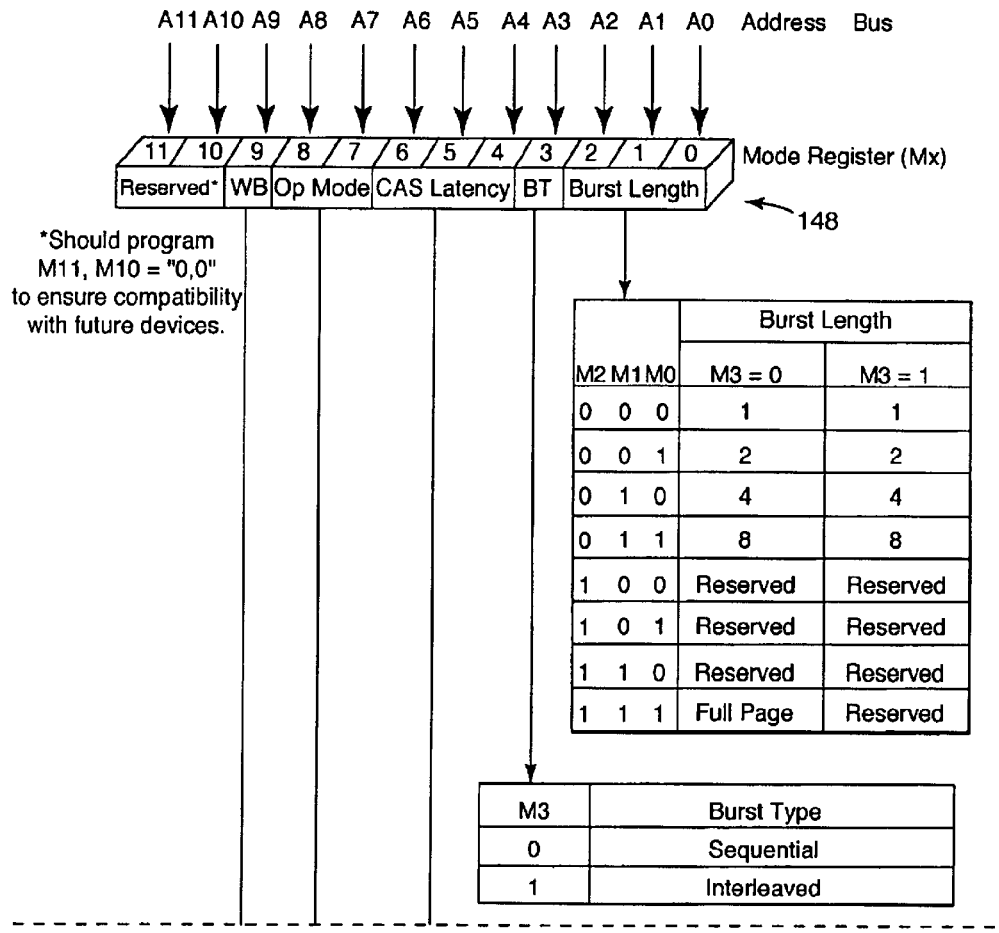
FIG. 2 illustrates a mode register of one embodiment of the present invention.
Figure 2B:
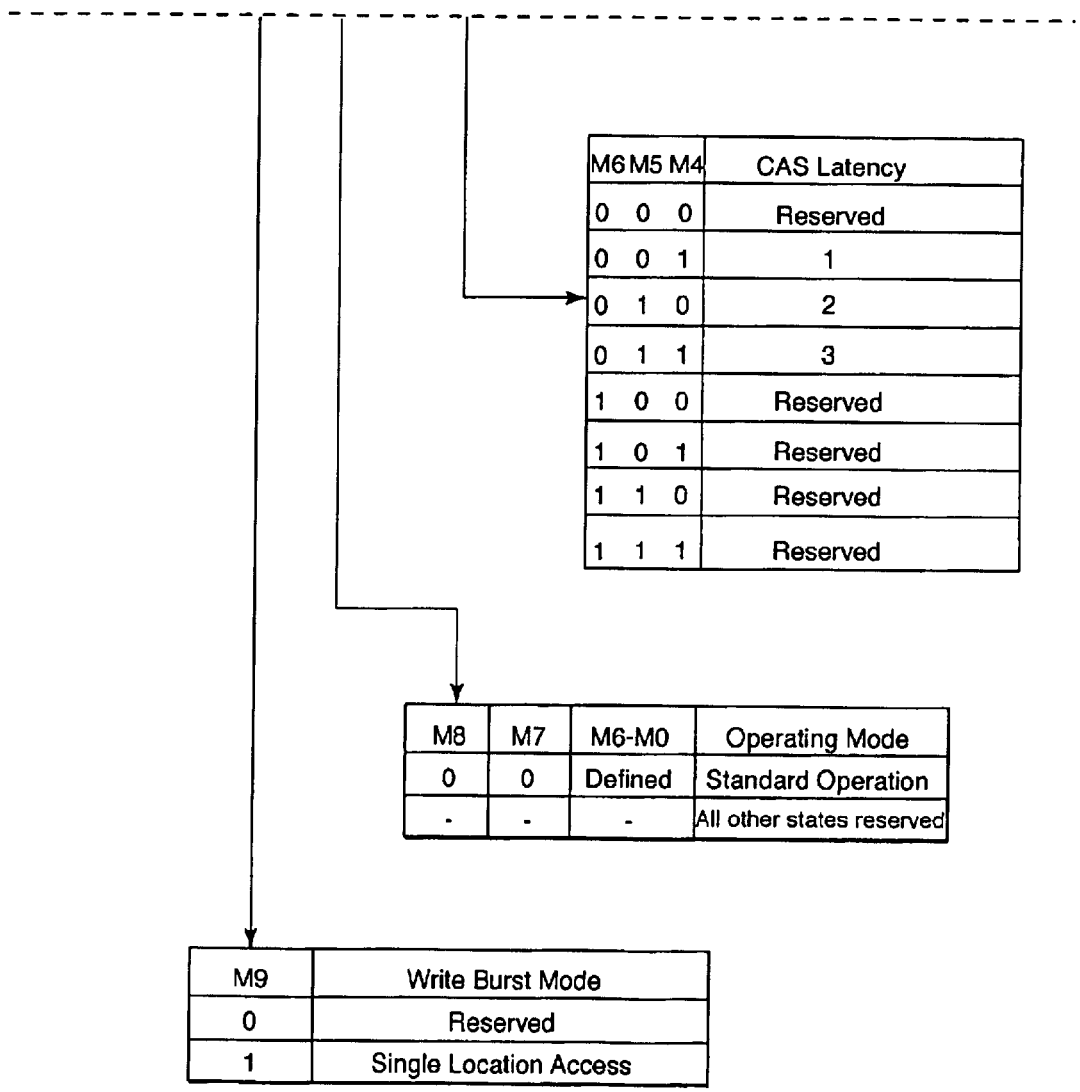

The Mode Register 148 is used to define the specific mode of operation of the synchronous flash memory. This definition includes the selection of a burst length, a burst type, a CAS latency, and an operating mode, as shown in FIG. 2. The Mode Register is programmed via a LOAD MODE REGISTER command and retains stored information until it is reprogrammed. The contents of the Mode Register may be copied into the NVMode Register 147. The NVMode Register settings automatically load the Mode Register 148 during initialization. Details on ERASE NVMODE REGISTER and WRITE NVMODE REGISTER command sequences are provided below. Those skilled in the art will recognize that an SDRAM requires that a mode register must be externally loaded during each initialization operation. The present invention allows a default mode to be stored in the NV mode register 147. The contents of the NV mode register are then copied into a volatile mode register 148 for access during memory operations.

Mode Register bits M0–M2 specify a burst length, M3 specifies a burst type (sequential or interleaved), M4–M6 specify a CAS latency, M7 and M8 specify a operating mode, M9 is set to one, and M10 and M11 are reserved in this embodiment. Because WRITE bursts are not currently implemented, M9 is set to a logic one and write accesses are single location (non-burst) accesses. The Mode Register must be loaded when all banks are idle, and the controller must wait the specified time before initiating a subsequent operation.

Read accesses to the synchronous flash memory can be burst oriented, with the burst length being programmable, as shown in Table 1. The burst length determines the maximum number of column locations that can be automatically accessed for a given READ command. Burst lengths of 1, 2, 4, or 8 locations are available for both sequential and the interleaved burst types, and a full-page burst is available for the sequential type. The full-page burst can be used in conjunction with the BURST TERMINATE command to generate arbitrary burst lengths that is, a burst can be selectively terminated to provide custom length bursts. When a READ command is issued, a block of columns equal to the burst length is effectively selected. All accesses for that burst take place within this block, meaning that the burst will wrap within the block if a boundary is reached. The block is uniquely selected by A1–A7 when the burst length is set to two, by A2–A7 when the burst length is set to four, and by A3–A7 when the burst length is set to eight. The remaining (least significant) address bit(s) are used to select the starting location within the block. Full-page bursts wrap within the page if the boundary is reached.

Accesses within a given burst may be programmed to be either sequential or interleaved; this is referred to as the burst type and is selected via bit M3. The ordering of accesses within a burst is determined by the burst length, the burst type and the starting column address, as shown in Table 1.

TABLE 1

BURST DEFINITION

| Burst Length | Starting Column Address A2 | A1 | A0 | Order of Accesses Within a Burst Type = Sequential | Type = Interleaved |
|---|---|---|---|---|---|
| 2 | | | 0 | 0-1 | 0-1 |
|  | | | 1 | 1-0 | 1-0 |
| 4 | | 0 | 0 | 0-1-2-3 | 0-1-2-3 |
|  | | 0 | 1 | 1-2-3-0 | 1-0-3-2 |
|  | | 1 | 0 | 2-3-0-1 | 2-3-0-1 |
|  | | 1 | 1 | 3-0-1-2 | 3-2-1-0 |
| 8 | 0 | 0 | 0 | 0-1-2-3-4-5-6-7 | 0-1-2-3-4-5-6-7 |
|  | 0 | 0 | 1 | 1-2-3-4-5-6-7-0 | 1-0-3-2-5-4-7-6 |
|  | 0 | 1 | 0 | 2-3-4-5-6-7-0-1 | 2-3-0-1-6-7-4-5 |
|  | 0 | 1 | 1 | 3-4-5-6-7-0-1-2 | 3-2-1-0-7-6-5-4 |
|  | 1 | 0 | 0 | 4-5-6-7-0-1-2-3 | 4-5-6-7-0-1-2-3 |
|  | 1 | 0 | 1 | 5-6-7-0-1-0-3-2 | 5-4-7-6-1-0-3-2 |
|  | 1 | 1 | 0 | 6-7-0-1-2-3-4-5 | 6-7-4-5-2-3-0-1 |
|  | 1 | 1 | 1 | 7-0-1-2-3-4-5-6 | 7-6-5-4-3-2-1-0 |
| Full Page 256 | n = A0–A7 (location 0–255) | | | Cn, Cn + 1, Cn + 2 Cn + 3, Cn + 4 . . . Cn − 1, Cn . . . | Not supported |

Notes for Table 1:
1 For a burst length of two, A1–A7 select the block-of-two burst; A0 selects the start column within the block.
2 For a burst length of four, A2–A7 select the block-of-four burst; A0–A1 select the starting column within the block.
3 For a burst length of eight, A3–A7 select the block-of-eight burst; A0–A2 select the starting column within the block.
4 For a full-page burst, the full row is selected and A0–A7 select the starting column.
5 Whenever a boundary of the block is reached within a given sequence above, the following access wraps within the block.
6 For a burst length of one, A0–A7 select the unique column to be accessed, and Mode Register bit M3 is ignored.

Figure 3:
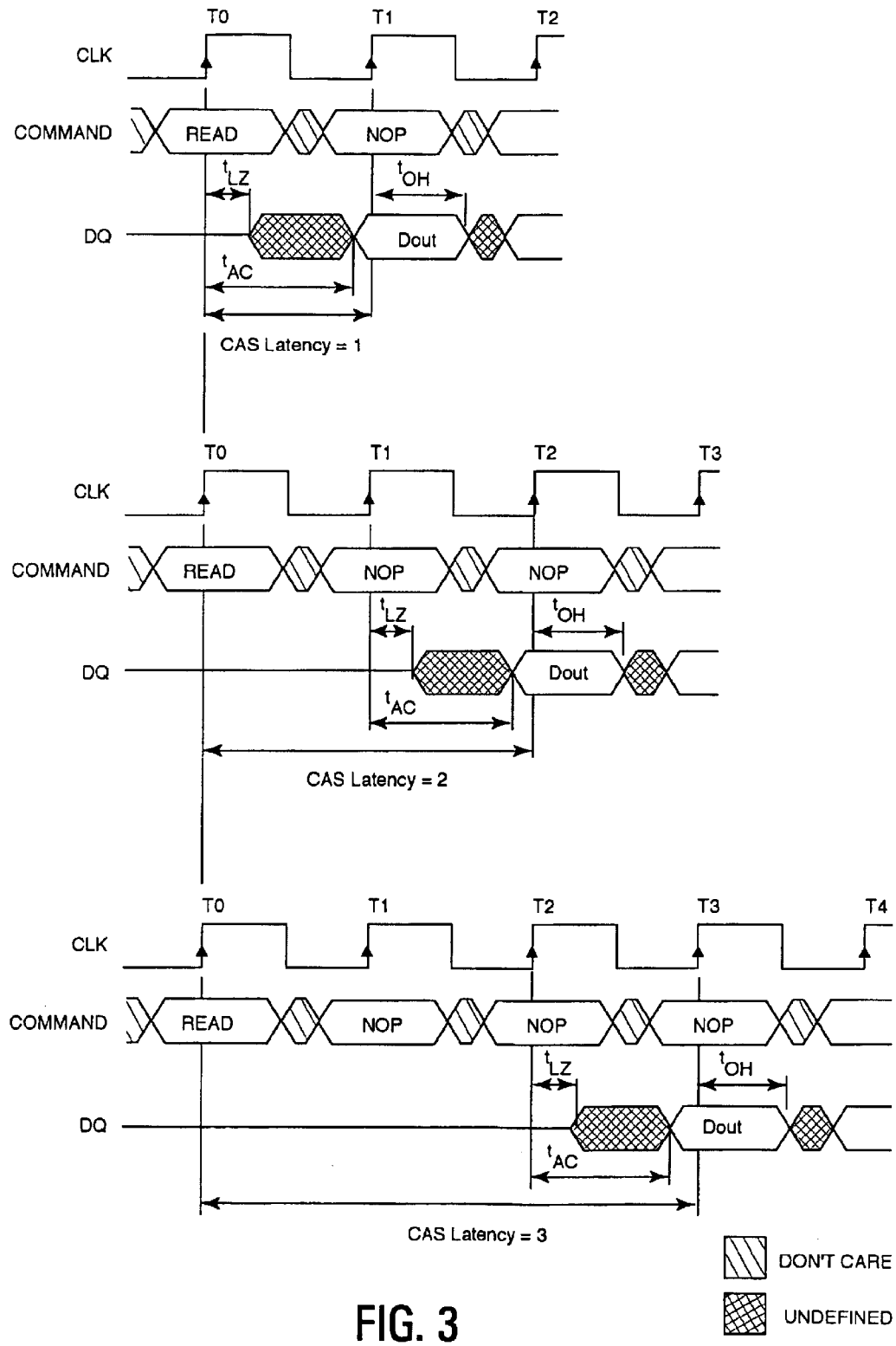
FIG. 3 illustrates read operations having a CAS latency of one, two and three clock cycles.

Column Address Strobe (CAS) latency is a delay, in clock cycles, between the registration of a READ command and the availability of the first piece of output data on the DQ connections. The latency can be set to one, two or three clocks cycles. For example, if a READ command is registered at clock edge n, and the latency is m clocks, the data will be available by clock edge n+m. The DQ connections will start driving data as a result of the clock edge one cycle earlier (n+m−1) and, provided that the relevant access times are met, the data will be valid by clock edge n+m. For example, assuming that the clock cycle time is such that all relevant access times are met, if a READ command is registered at T0, and the latency is programmed to two clocks, the DQs will start driving after T1 and the data will be valid by T2, as shown in FIG. 3. FIG. 3 illustrates example operating frequencies at which different clock latency setting can be used. The normal operating mode is selected by setting M7 and M8 to zero, and the programmed burst length applies to READ bursts.

Table 2 provides sample operating frequencies in MHz for a memory according to embodiments of the present invention.

TABLE 2

| SPEED | CAS LATENCY = 1 | CAS LATENCY = 2 | CAS LATENCY = 3 |
|---|---|---|---|
| −10 | 33 MHz | 66 MHz | 100 MHz |
| −12 | 33 MHz | 66 MHz | 83 MHz |

The following truth tables provide more detail on the operation commands of an embodiment of the memory of the present invention. An explanation is provided herein of the commands and follows Truth Table 2.

TRUTH TABLE 1

Interface Commands and DQM Operation
(Notes: 1)

| NAME (FUNCTION) | CS# | RAS# | CAS# | WE# | DQM | ADDR | DQs | NOTES |
|---|---|---|---|---|---|---|---|---|
| COMMAND INHIBIT (NOP) | H | X | X | X | X | X | X | |
| NO OPERATION (NOP) | L | H | H | H | X | X | X | |
| ACTIVE (Select bank and activate row) | L | L | H | H | X | Bank/Row | X | 2 |
| READ (Select bank, column and start READ burst) | L | H | L | H | X | Bank/Col | X | 3 |
| WRITE (Select bank, column and start WRITE) | L | H | L | L | X | Bank/Col | Valid | 3, 4 |
| BURST TERMINATE | L | H | H | L | X | X | Active | |
| ACTIVE TERMINATE | L | L | H | L | X | X | X | 5 |
| LOAD COMMAND REGISTER | L | L | L | H | X | Com Code | X | 6, 7 |
| LOAD MODE REGISTER | L | L | L | L | X | Op Code | X | 8 |
| Write Enable/Output Enable | — | — | — | — | L | — | Active | 9 |
| Write Inhibit/Output High-Z | — | — | — | — | H | — | High-Z | 9 |

Notes for Truth Table 1:
1 CKE is HIGH for all commands shown.
2 A0–A11 provide row-address and BA0, BA1 determine which bank is made active.
3 A0–A7 provide column address. BA0 and BA1 determine which bank is being read from or written to.
4 A WRITE SETUP command sequence (see Truth Table 2) must be completed prior to executing a WRITE.
5 ACTIVE TERMINATE is functionally equivalent to the SDRAM PRECHARGE command, however, PRECHARGE (Deactivate row in bank or banks) is not required for Synchronous Flash memories.
6 A0–07 define the Command Code, A8–A11 are "Don't Care" for this operation. See Truth Table 2.
7 LOAD COMMAND REGISTER (LCR) replaces the SDRAM AUTO REFRESH or SELF REFRESH mode which is not required for Synchronous Flash memories. LCR is the first cycle for Flash Memory Command Sequence operation. See Truth Table 2.
8 A0–A11 define the Operation Code written to the Mode Register. The Mode Register can be dynamically loaded each cycle provided tMRD is satisfied. A default Mode Register value may be stored in the NVMode Register. The contents of the NVMode Register are automatically loaded into the Mode Register during device initialization.
9 Activates or deactivates the DQs during WRITEs (zero-clock delay) and READs (two-clock delay).

TRUTH TABLE 2

Flash Memory Command Sequences
Notes: (1, 2, 3, 4, 17, 18)

| | 1st CYCLE | | | | | 2nd CYCLE | | | | 3rd CYCLE | | | | | |
|---|---|---|---|---|---|---|---|---|---|---|---|---|---|---|---|
| Operation | CMD | ADDR | ADDR | DQ | RP# | CMD | ADDR | ADDR | DQ | RP# | CMD | ADDR | ADDR | DQ | RP# | NOTE |
| READ DEVICE Config. | LCR | 90H | Bank | X | H | ACTIVE | Row | Bank | X | H | READ | CA | Bank | X | H | 5 6 |
| READ Status Register | LCR | 70H | X | X | H | ACTIVE | X | X | X | H | READ | X | X | X | H | |
| CLEAR Status Register | LCR | 50H | X | X | H | | | | | | | | | | | |
| ERASE SETUP/Confirm | LCR | 20H | Bank | X | H | ACTIVE | Row | Bank | X | H | WRITE | X | Bank | D0H | H/V$_{HH}$ | 7 8 9 10 |
| WRITE SETUP/WRITE | LCR | 40H | Bank | X | H | ACTIVE | Row | Bank | X | H | WRITE | Col | Bank | DIN | H/V$_{HH}$ | 7 8 10 |
| Protect BLOCK/Confirm | LCR | 60H | Bank | X | H | ACTIVE | Row | Bank | X | H | WRITE | X | Bank | 01H | H/V$_{HH}$ | 7 8 10 11 12 |

TRUTH TABLE 2-continued

Flash Memory Command Sequences
Notes: (1, 2, 3, 4, 17, 18)

| Operation | 1st CYCLE | | | | | 2nd CYCLE | | | | | 3rd CYCLE | | | | | NOTE |
|---|---|---|---|---|---|---|---|---|---|---|---|---|---|---|---|---|
| | CMD | ADDR | ADDR | DQ | RP# | CMD | ADDR | ADDR | DQ | RP# | CMD | ADDR | ADDR | DQ | RP# | |
| Protect Device/ Confirm | LCR | 60H | Bank | X | H | ACTIVE | X | Bank | X | H | WRITE | X | Bank | F1H | $V_{HH}$ | 7 8 13 |
| Unprotect Blocks/ Confirm | LCR | 60H | Bank | X | H | ACTIVE | X | Bank | X | H | WRITE | X | Bank | D0H | $H/V_{HH}$ | 7 8 14 15 |
| ERASE NVMODE REGISTER | LCR | 30H | Bank | X | H | ACTIVE | X | Bank | X | H | WRITE | X | Bank | C0H | H | 7 8 16 |
| WRITE NVMODE REGISTER | LCR | A0H | Bank | X | H | ACTIVE | X | Bank | X | H | WRITE | X | Bank | X | H | 7 8 |

Notes for Truth Table 2:
1 CMD = Command: Decoded from CS#, RAS#, WE# input pins.
2 NOP/COMMAND INHIBIT commands can be issued throughout any operation command sequence.
3 After a write or erase operation is registered to the ISM and prior to completion of the ISM operation, a READ to any location in the bank under ISM control may result in invalid data.
4 In order to meet the tRCD specification, the appropriate number of NOP/COMMAND INHIBIT cycles must be issued between the ACTIVE and READ/WRITE command cycles.
5 The bank address is required for the block protect bit location; bank address is "Don't Care" for manufacturer compatibility ID, device ID, and device protect bit location.
6 CA = Configuration address:
000000H - Manufacturer compatibility ID
000001H - Device ID
xx0002H - Block protect bit
000003H - Device protect bit
7 The proper command sequence (LCR/ACTIVE/WRITE) is needed to initiate an erase/write/protect/block/unprotect operation.
8 The bank address must match for all three command (LCR/ACTIVE/WRITE) cycles to initiate an erase/write/protect/block unprotect operation.
9 The D0H code is needed at the start of the WRITE command cycle to confirm and initiate an erase operation.
10 If the device protect bit is set, then an erase/write/block protect operation can still be initiated by bringing RP# to $V_{HH}$ at the start of the WRITE command cycle and holding it at $V_{HH}$ until the operation is completed. $V_{HH}$ = 5 V.
11 The A10, A11 row address and BA0, BA1 bank address select the block to be protected; A0–A9 are "Don't Care."
12 The 01H code is needed at the start of a WRITE command cycle to confirm and initiate a block protect operation.
13 The F1H code is needed at the start of a WRITE command cycle to confirm and initiate a device protect operation.
14 The D0H code is needed at the start of a WRITE command cycle to confirm and initiate a block unprotect operation.
15 If the device protect bit is not set, then holding the RP# pin HIGH unprotects all sixteen 256 K-word erasable blocks, except for the top and bottom blocks (see FIG. 15). When RP# = 5 V, all sixteen 256 K-word erasable blocks (including the top and bottom blocks) will be unprotected, and the device protect bit will be ignored. If the device protect bit is set and RP# is HIGH, the block protect bits cannot be modified.
16 The C0H code is needed at the start of a WRITE command cycle to confirm and initiate an ERASE NVMode Register operation.
17 BURST WRITE operation is not supported.
18 The erase/write/protect/block unprotect operations are self-timed. The Status Register must be polled to monitor these operations.

The COMMAND INHIBIT function prevents new commands from being executed by the synchronous flash memory, regardless of whether the CLK signal is enabled. The synchronous flash memory is effectively deselected, but operations already in progress are not affected.

The NO OPERATION (NOP) command is used to perform a NOP to the synchronous flash memory that is selected (CS# is LOW). This prevents unwanted commands from being registered during idle or wait states, and operations already in progress are not affected.

The mode register data is loaded via inputs A0–A11. The LOAD MODE REGISTER command can only be issued when all array banks are idle, and a subsequent executable command cannot be issued until a predetermined time delay (MRD) is met. The data in the NVMode Register 147 is automatically loaded into the Mode Register 148 upon power-up initialization and is the default data unless dynamically changed with the LOAD MODE REGISTER command.

An ACTIVE command is used to open (or activate) a row in a particular array bank for a subsequent access. The value on the BA0, BA1 inputs selects the bank, and the address provided on inputs A0–A11 selects the row. This row remains active for accesses until the next ACTIVE command, power-down or RESET.

The READ command is used to initiate a burst read access to an active row. The value on the BA0, BA1 inputs selects the bank, and the address provided on inputs A0–A7 selects the starting column location. Read data appears on the DQs subject to the logic level on the data mask (DQM) input that was present two clocks earlier. If a given DQM signal was registered HIGH, the corresponding DQs will be High-Z (high impedance) two clocks later; if the DQM signal was registered LOW, the DQs will provide valid data. Thus, the DQM input can be used to mask output data during a read operation.

A WRITE command is used to initiate a single-location write access on an active row. A WRITE command must be preceded by a WRITE SETUP command. The value on the BA0, BA1 inputs selects the bank, and the address provided on inputs A0–A7 selects a column location. Input data appearing on the DQs is written to the memory array, subject to the DQM input logic level appearing coincident with the data. If a given DQM signal is registered LOW, the corresponding data will be written to memory; if the DQM signal is registered HIGH, the corresponding data inputs will be ignored, and a WRITE will not be executed to that word/column location. A WRITE command with DQM HIGH is considered a NOP.

An ACTIVE TERMINATE command is not required for synchronous flash memories, but can be provided to terminate a read in a manner similar to the SDRAM PRECHARGE command. The ACTIVE TERMINATE command can be issued to terminate a BURST READ in progress, and may or may not be bank specific.

A BURST TERMINATE command is used to truncate either fixed-length or full-page bursts. The most recently registered READ command prior to the BURST TERMINATE command will be truncated. BURST TERMINATE is not bank specific.

The Load Command Register operation is used to initiate flash memory control commands to the Command Execution Logic (CEL) 130. The CEL receives and interprets commands to the device. These commands control the operation of the Internal State Machine 132 and the read path (i.e., memory array 102, ID Register 136 or Status Register 134).

Figure 4:
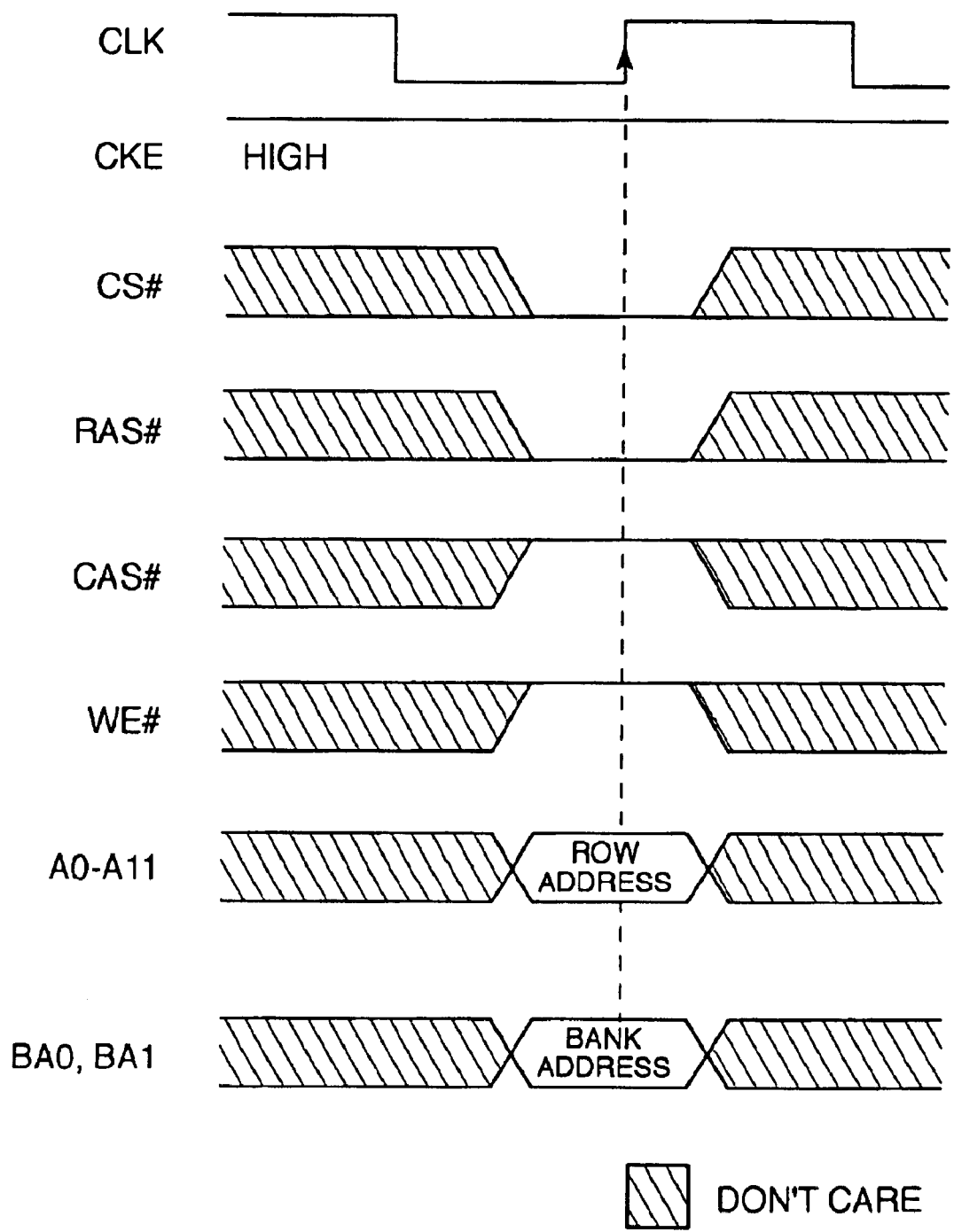
FIG. 4 illustrates activating a specific row in a bank of the memory of one embodiment of the present invention.

Before any READ or WRITE commands can be issued to a bank within the synchronous flash memory, a row in that bank must be "opened." This is accomplished via the ACTIVE command (defined by CS#, WE#, RAS#, CAS#), which selects both the bank and the row to be activated, see FIG. 4.

Figure 5:
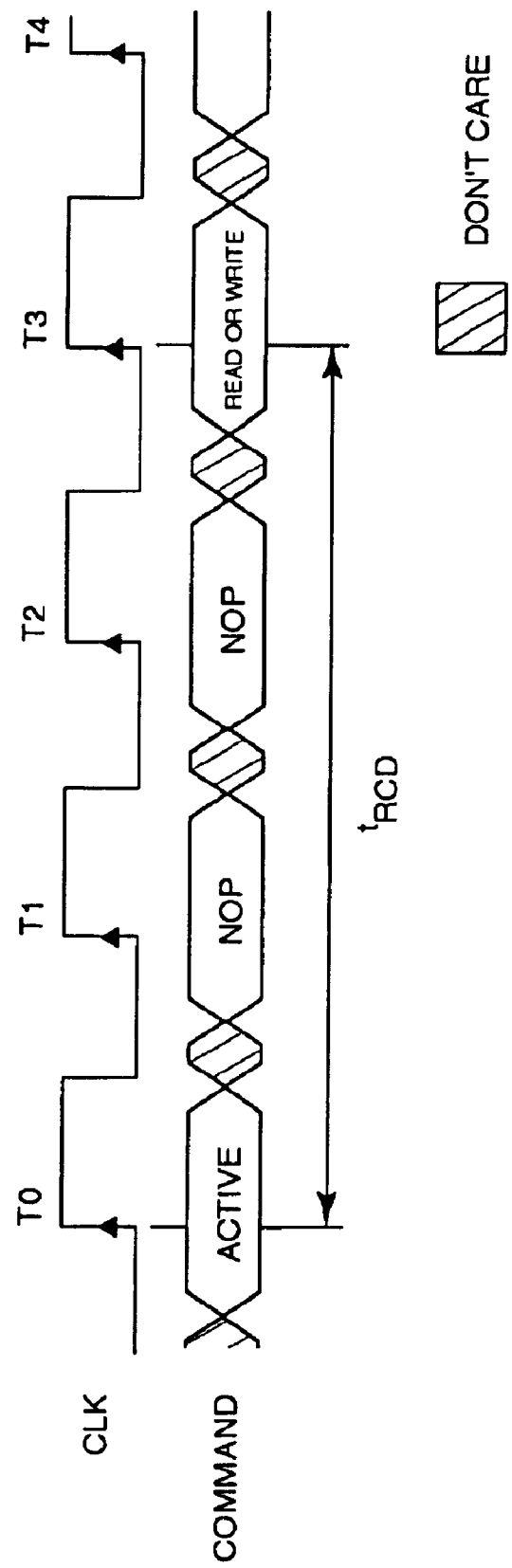
FIG. 5 illustrates timing between an active command and a read or write command.

After opening a row (issuing an ACTIVE command), a READ or WRITE command may be issued to that row, subject to a time period (tRCD) specification, tRCD (MIN) should be divided by the clock period and rounded up to the next whole number to determine the earliest clock edge after the ACTIVE command on which a READ or WRITE command can be entered. For example, a tRCD specification of 30 ns with a 90 MHZ clock (11.11 ns period) results in 2.7 clocks, which is rounded to 3. This is reflected in FIG. 5, which covers any case where 2<tRCD (MIN)/tCK≦3. (The same procedure is used to convert other specification limits from time units to clock cycles).

A subsequent ACTIVE command to a different row in the same bank can be issued without having to close a previous active row, provided the minimum time interval between successive ACTIVE commands to the same bank is defined by tRC.

A subsequent ACTIVE command to another bank can be issued while the first bank is being accessed, which results in a reduction of total row access overhead. The minimum time interval between successive ACTIVE commands to different banks is defined by a time period tRRD.

Figure 6:
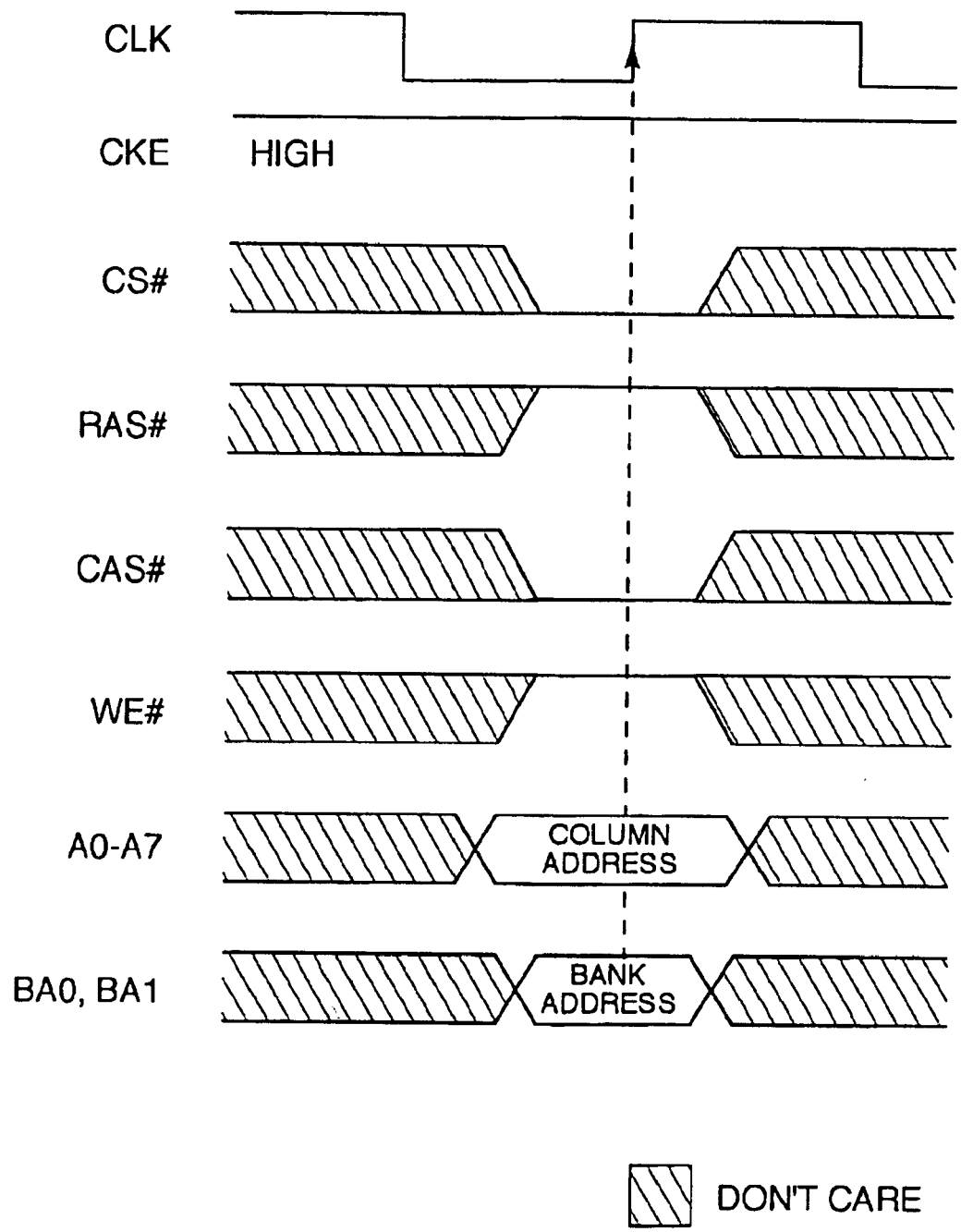
FIG. 6 illustrates a read command.
Figure 7:
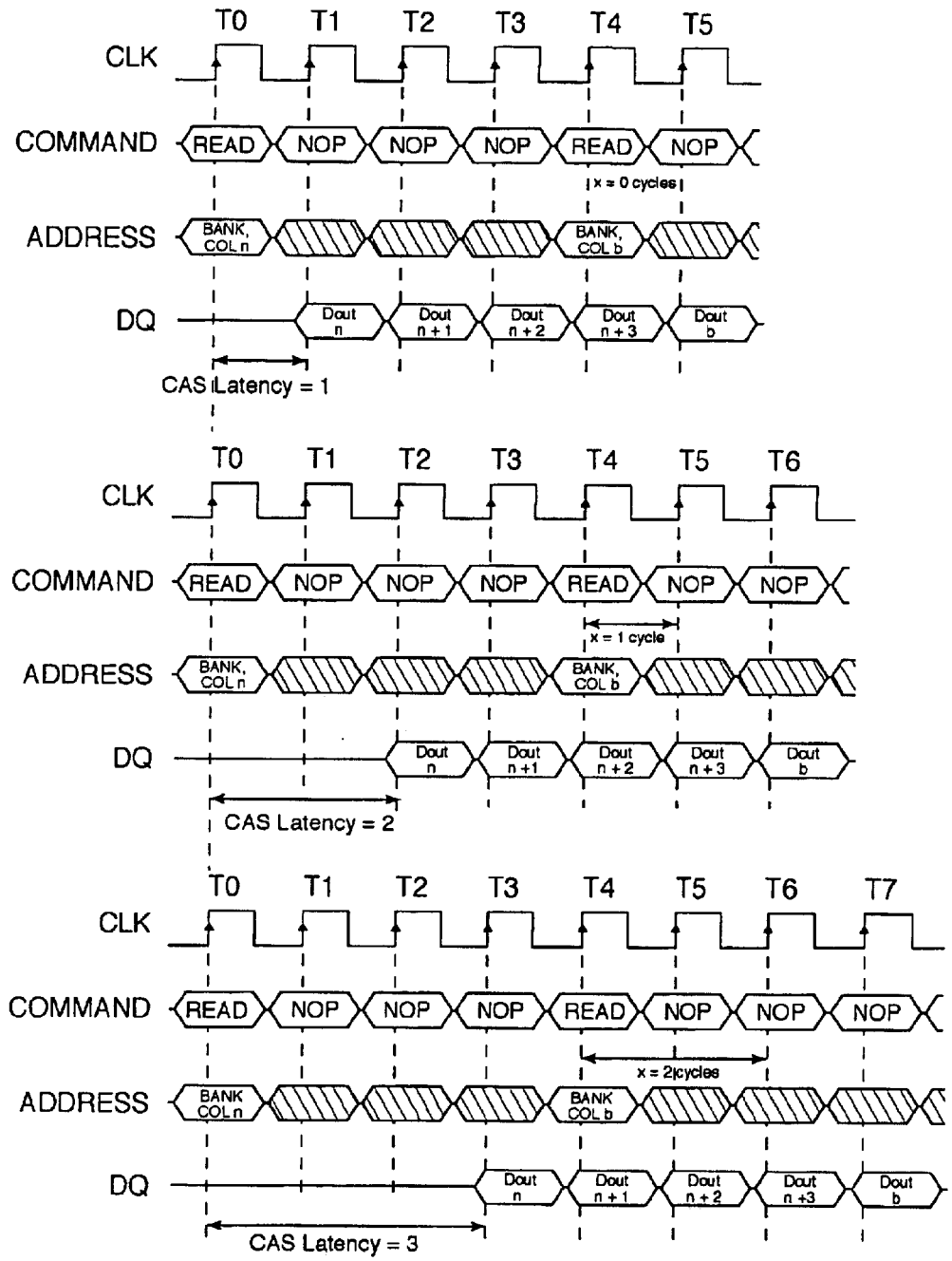
FIG. 7 illustrates timing for consecutive read bursts of one embodiment of the present invention.
Figure 8:
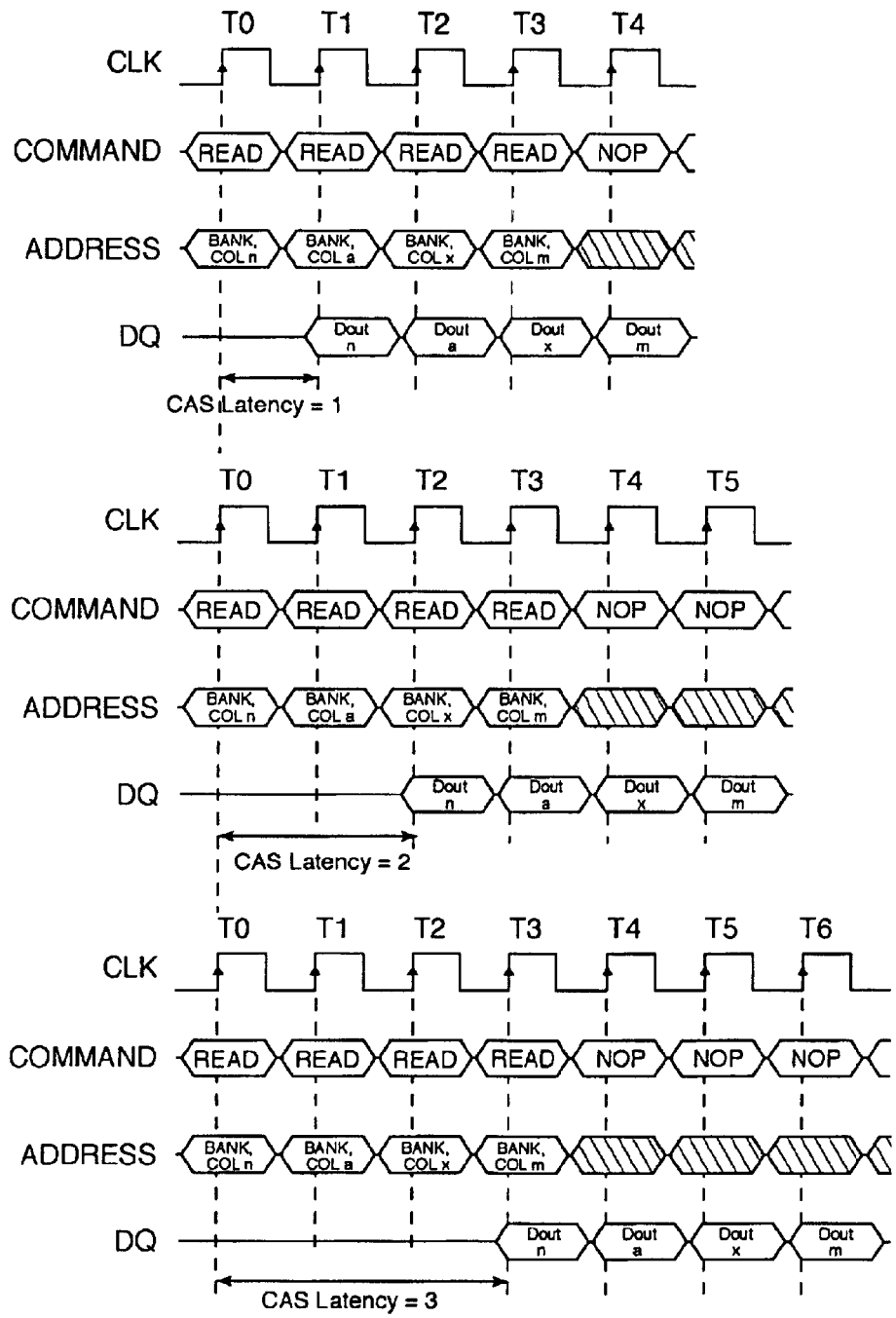
FIG. 8 illustrates random read accesses within a page of one embodiment of the present invention.

READ bursts are initiated with a READ command (defined by CS#, WE#, RAS#, CAS#), as shown in FIG. 6. The starting column and bank addresses are provided with the READ command. During READ bursts, the valid data-out element from the starting column address will be available following the CAS latency after the READ command. Each subsequent data-out element will be valid by the next positive clock edge. Upon completion of a burst, assuming no other commands have been initiated, the DQs will go to a High-Z state. A full page burst will continue until terminated. (At the end of the page, it will wrap to column 0 and continue.) Data from any READ burst may be truncated with a subsequent READ command, and data from a fixed-length READ burst may be immediately followed by data from a subsequent READ command. In either case, a continuous flow of data can be maintained. The first data element from the new burst follows either the last element of a completed burst, or the last desired data element of a longer burst that is being truncated. The new READ command should be issued x cycles before the clock edge at which the last desired data element is valid, where x equals the CAS latency minus one. This is shown in FIG. 7 for CAS latencies of one, two and three; data element n+3 is either the last of a burst of four, or the last desired of a longer burst. The synchronous flash memory uses a pipelined architecture and therefore does not require the 2n rule associated with a prefetch architecture. A READ command can be initiated on any clock cycle following a previous READ command. Full-speed, random read accesses within a page can be performed as shown in FIG. 8, or each subsequent READ may be performed to a different bank.

Data from any READ burst may be truncated with a subsequent WRITE command (WRITE commands must be preceded by WRITE SETUP), and data from a fixed-length READ burst may be immediately followed by data from a subsequent WRITE command (subject to bus turnaround limitations). The WRITE may be initiated on the clock edge immediately following the last (or last desired) data element from the READ burst, provided that I/O contention can be avoided. In a given system design, there may be the possibility that the device driving the input data would go Low-Z before the synchronous flash memory DQs go High-Z. In this case, at least a single-cycle delay should occur between the last read data and the WRITE command.

Figure 9:
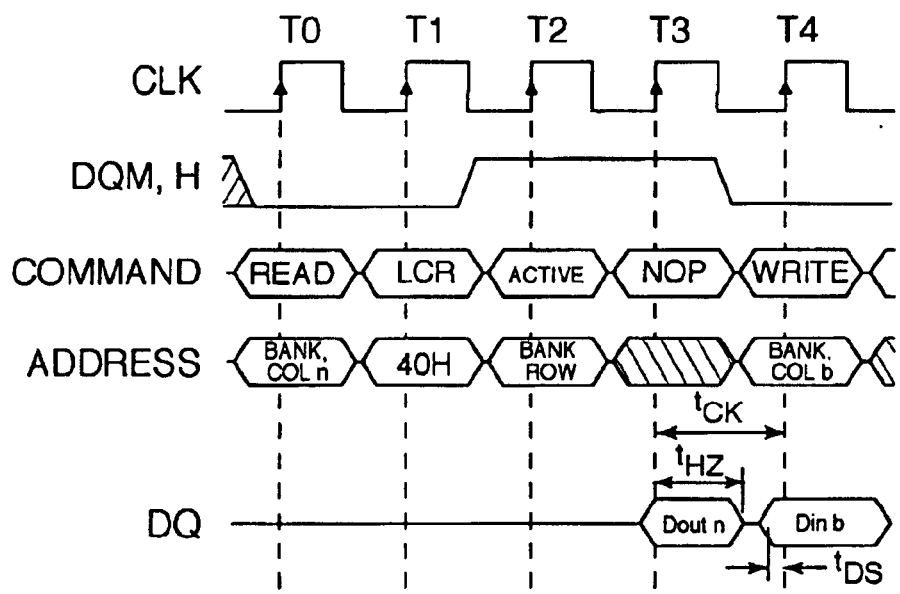
FIG. 9 illustrates a read operation followed by a write operation.

The DQM input is used to avoid I/O contention as shown in FIG. 9. The DQM signal must be asserted (HIGH) at least two clocks prior to the WRITE command (DQM latency is two clocks for output buffers) to suppress data-out from the READ. Once the WRITE command is registered, the DQs will go High-Z (or remain High-Z) regardless of the state of the DQM signal. The DQM signal must be de-asserted prior to the WRITE command (DQM latency is zero clocks for input buffers) to ensure that the written data is not masked. FIG. 9 shows the case where the clock frequency allows for bus contention to be avoided without adding a NOP cycle.

Figure 10:
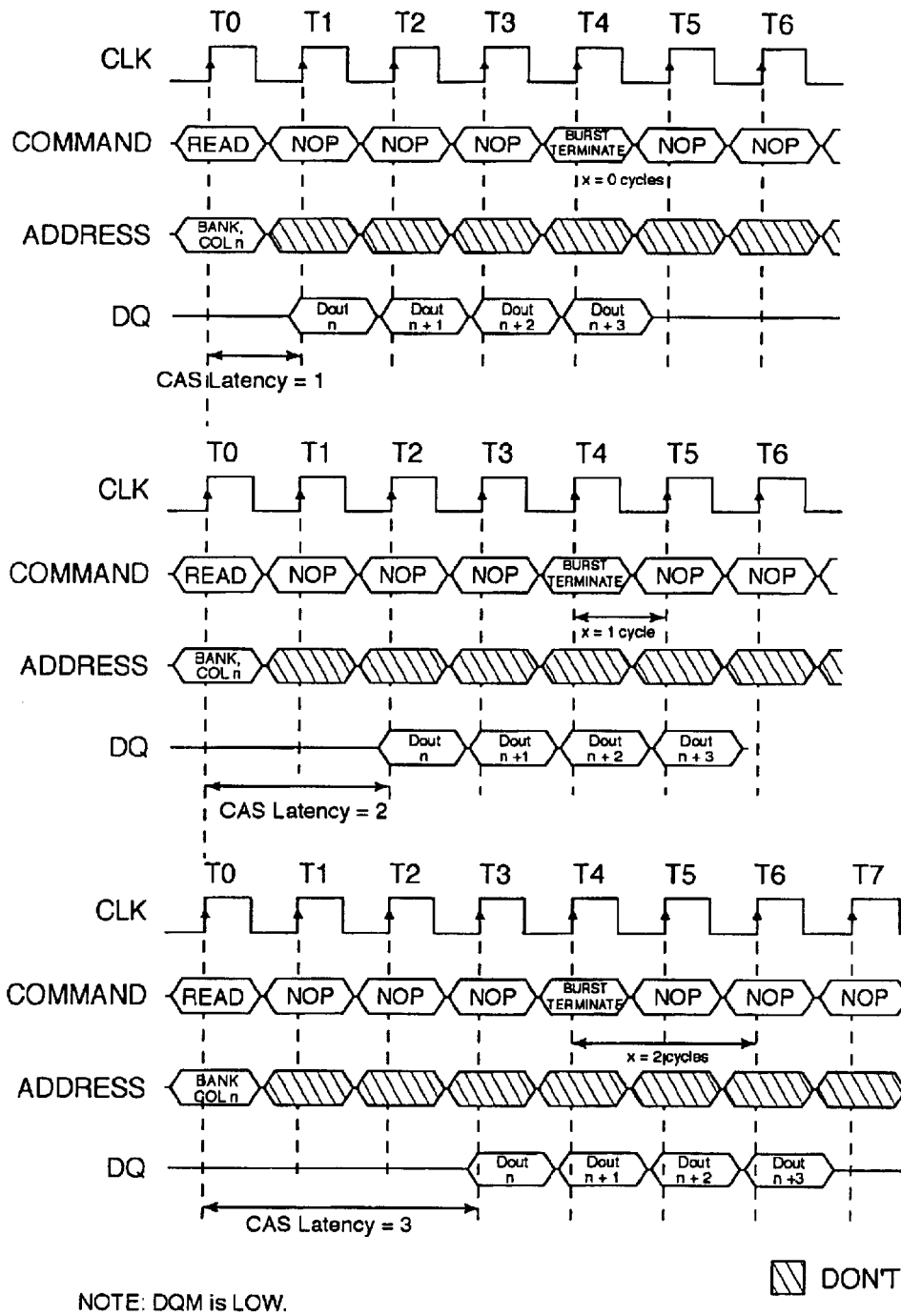
FIG. 10 illustrates read burst operation that are terminated using a burst terminate command according to one embodiment of the present invention.

A fixed-length or full-page READ burst can be truncated with either ACTIVE TERMINATE (may or may not be bank specific) or BURST TERMINATE (not bank specific) commands. The ACTIVE TERMINATE or BURST TERMINATE command should be issued x cycles before the clock edge at which the last desired data element is valid, where x equals the CAS latency minus one. This is shown in FIG. 10 for each possible CAS latency; data element n+3 is the last desired data element of a burst of four or the last desired of a longer burst.

Figure 11:
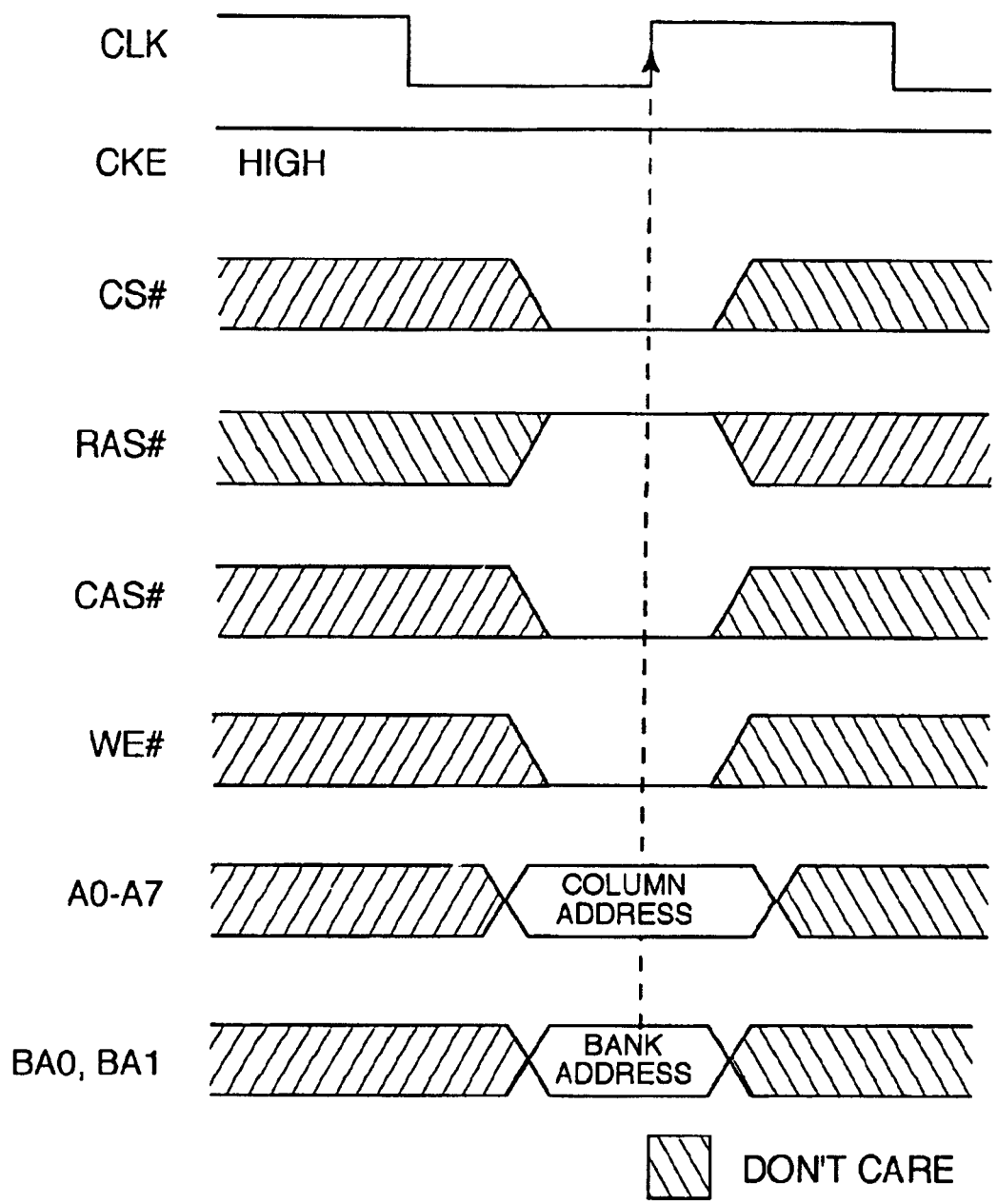
FIG. 11 illustrates a write command.

A single-location WRITE is initiated with a WRITE command (defined by CS#, WE#, RAS#, CAS#) as shown in FIG. 11. The starting column and bank addresses are provided with the WRITE command. Once a WRITE command is registered, a READ command can be executed as defined by Truth Tables 4 and 5. An example is shown in FIG. 12. During a WRITE, the valid data-in is registered coincident with the WRITE command.

Unlike SDRAM, synchronous flash does not require a PRECHARGE command to deactivate the open row in a particular bank or the open rows in all banks. The ACTIVE TERMINATE command is similar to the BURST TERMINATE command; however, ACTIVE TERMINATE may or may not be bank specific. Asserting input A10 HIGH during an ACTIVE TERMINATE command will terminate a BURST READ in any bank. When A10 is low during an ACTIVE TERMINATE command, BA0 and BA1 will determine which bank will undergo a terminate operation. ACTIVE TERMINATE is considered a NOP for banks not addressed by A10, BA0, BA1.

Power-down occurs if clock enable, CKE is registered LOW coincident with a NOP or COMMAND INHIBIT, when no accesses are in progress. Entering power-down deactivates the input and output buffers (excluding CKE) after internal state machine operations (including WRITE operations) are completed, for power savings while in standby.

Figure 13:
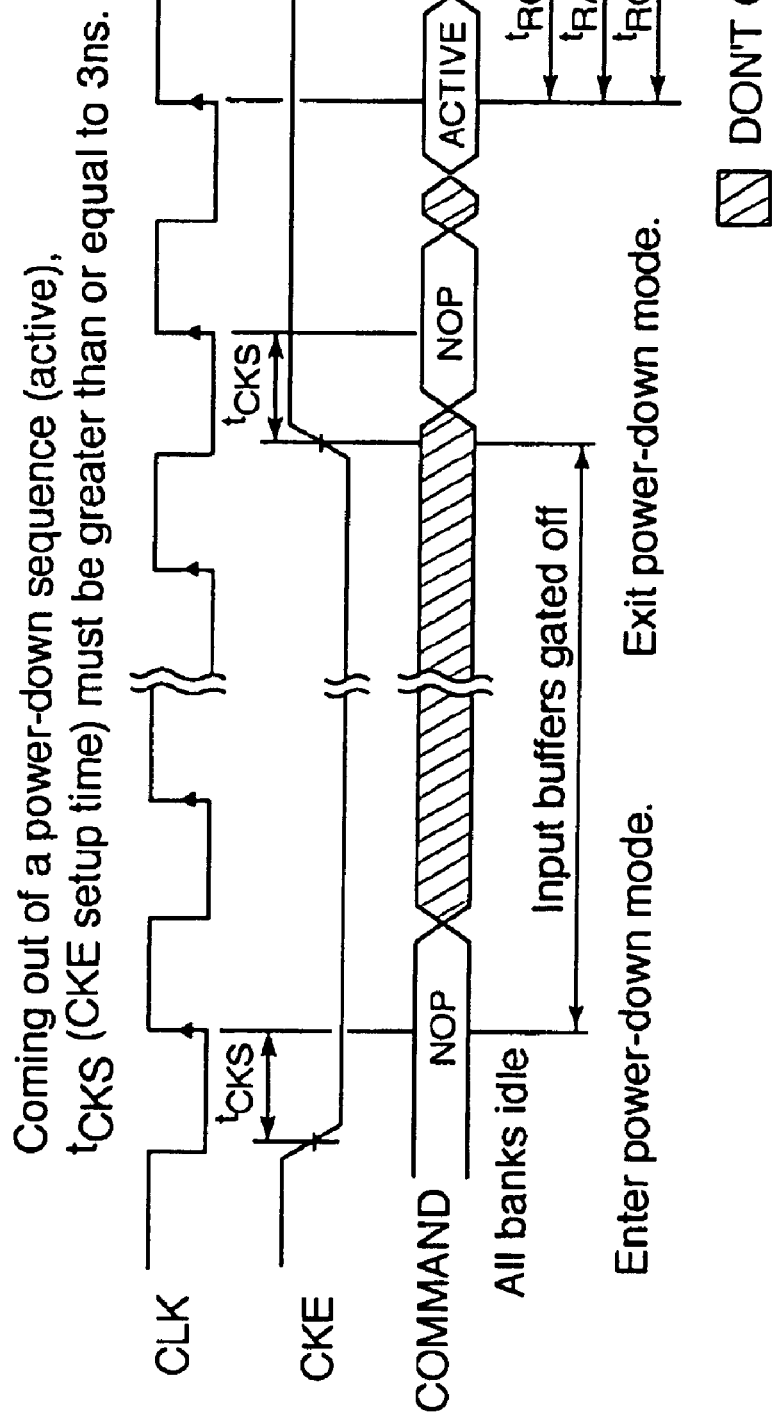
FIG. 13 illustrates a power-down operation of one embodiment of the present invention.

The power-down state is exited by registering a NOP or COMMAND INHIBIT and CKE HIGH at the desired clock edge (meeting tCKS). See FIG. 13 for an example power-down operation.

Figure 14:
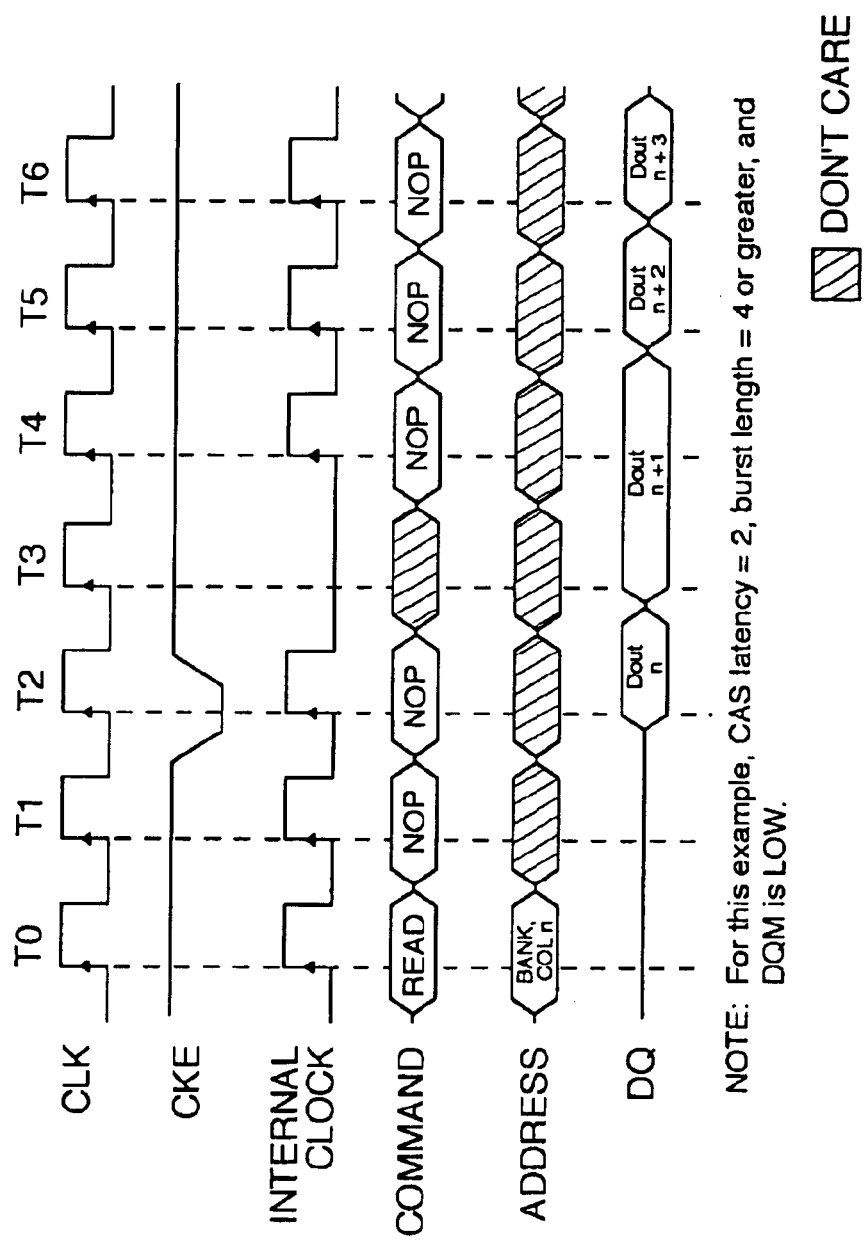
FIG. 14 illustrates a clock suspend operation during a burst read.

A clock suspend mode occurs when a column access/burst is in progress and CKE is registered LOW. In the clock suspend mode, an internal clock is deactivated, "freezing" the synchronous logic. For each positive clock edge on which CKE is sampled LOW, the next internal positive clock edge is suspended. Any command or data present on the input pins at the time of a suspended internal clock edge are ignored, any data present on the DQ pins will remain driven, and burst counters are not incremented, as long as the clock is suspended (see example in FIG. 14). Clock suspend mode is exited by registering CKE HIGH; the internal clock and related operation will resume on the subsequent positive clock edge.

The burst read/single write mode is a default mode in one embodiment. All WRITE commands result in the access of a single column location (burst of one), while READ commands access columns according to the programmed burst length and sequence. The following Truth Table 3 illustrates memory operation using the CKE signal.

TRUTH TABLE 3

CKE
(Notes 1–4)

| $CKE_{n-1}$ | $CKE_n$ | CURRENT STATE | $COMMAND_n$ | $ACTION_n$ | NOTES |
|---|---|---|---|---|---|
| L | L | POWER-DOWN | X | Maintain POWER-DOWN | |
| | | CLOCK SUSPEND | X | Maintain CLOCK-SUSPEND | |
| L | H | POWER-DOWN | COMMAND INHIBIT or NOP | Exit POWER-DOWN | 5 |
| | | CLOCK SUSPEND | X | Exit CLOCK SUSPEND | 6 |
| H | L | All Banks Idle Reading or Writing | COMMAND INHIBIT or NOP VALID | POWER-DOWN Entry CLOCK SUSPEND Entry | |
| H | H | See Truth Table 4 | | | |

Notes for Truth Table 3:
1 $CKE_n$ is the logic state of CKE at clock edge n; $CKE_{n-1}$ was the state of CKE at the previous clock edge.
2 CURRENT STATE is the state of the synchronous flash memory immediately prior to clock edge n.
3 $COMMAND_n$ is the command registered at clock edge n and $ACTION_n$ is a result of $COMMAND_n$.
4 All states and sequences not shown are illegal or reserved.
5 Exiting POWER-DOWN at clock edge n will put the device in the All Banks Idle state in time for clock n + 1 (provided that tCKS is met).
6 After exiting CLOCK SUSPEND at clock edge n, the device will resume operation and recognize the next command at clock edge n + 1.

The following Table further illustrates the command operation when $CKE_{n-1}$ and $CKE_n$ are high.

TRUTH TABLE 4

Current State Bank n - Command to Bank n
(Notes 1–6)

| CURRENT STATE | CS# | RAS# | CAS# | WE# | COMMAND/ACTION | Notes |
|---|---|---|---|---|---|---|
| Any | H | X | X | X | COMMAND INHIBIT (NOP/continue previous operation) | |
| | L | H | H | H | NO OPERATION (NOP/continue previous operation | |
| Idle | L | L | H | H | ACTIVE (Select and activate row) | |
| | L | L | L | H | LOAD COMMAND REGISTER | |
| | L | L | L | L | LOAD MODE REGISTER | 7 |
| | L | L | H | L | ACTIVE TERMINATE | 8 |

TRUTH TABLE 4-continued

Current State Bank n - Command to Bank n
(Notes 1–6)

| CURRENT STATE | CS# | RAS# | CAS# | WE# | COMMAND/ACTION | Notes |
|---|---|---|---|---|---|---|
| Row Active | L | H | L | H | READ (Select column and start READ burst) | |
| | L | H | L | L | WRITE (Select column and start WRITE) | 8 |
| | L | L | H | L | WRITE) | |
| | L | L | L | H | ACTIVE TERMINATE LOAD COMMAND REGISTER | |
| READ | L | H | L | H | READ (Select column and start new READ burst) | |
| | L | H | L | L | WRITE (Select column and start | 8 |
| | L | L | H | L | WRITE) | 9 |
| | L | H | H | L | ACTIVE TERMINATE | |
| | L | L | L | H | BURST TERMINATE LOAD COMMAND REGISTER | |
| WRITE | L | H | L | H | READ (Select column and start new READ burst) | 10 |
| | L | L | L | H | LOAD COMMAND REGISTER | |

Notes for Truth Table 4:
1 This table applies $CKE_{n-1}$ was HIGH and $CKE_n$ is HIGH (see Truth Table 3).
2 This table is bank specific, except where noted: i.e., the CURRENT STATE is for a specific bank and the commands shown are those allowed to be issued to that bank, when in that state. Exceptions are covered in the notes below.
3 Current state definitions:
Idle: The bank is not in initialize, read, write mode and tRP has been met.
Row Active: A row in the bank has been activated and tRCD has been met. No data bursts/accesses and no register accesses are in progress.
Read: A READ burst has been initiated and has not yet terminated or been terminated.
Write: A WRITE operation has been initiated to the Internal State Machine and has not yet been completed.
4 The following states must not be interrupted by a command issued to the same bank. COMMAND INHIBIT or NOP commands, or allowable commands to the other bank should be issued on any clock edge occurring during these states. Allowable commands to the other bank are determined by its current state and Truth Table 4, and according to Truth Table 5.
Active Terminate: Starts with registration of an ACTIVE TERMINATE command and ends with tRP is met. Once tRP is met, the bank will be in the Idle state.
Row Activating: Starts with registration of an ACTIVE command and ends with tRCD is met. Once tRCD is met, the bank will be in the Row Active state.
5 The following states must not be interrupted by an executable command; COMMAND INHIBIT or NOP commands must be applied on each positive clock edge during these states.
Accessing Mode Register: Starts with registration of a LOAD MODE REGISTER command, and ends with tMRD has been met. Once the tMRD is met, the synchronous flash' memory will be in the All Banks Idle state.
Initialize Mode: Starts with RP# transitioning from LOW to HIGH and ends after 100 $\mu$s delay.
6 All states and sequences not shown are illegal or reserved.
7 Not bank specific; requires that all banks are idle.
8 May or may not be bank specific.
9 Not bank specific; BURST TERMINATE affects the most recent READ burst, regardless of bank.
10 A READ to Bank n is allowed; however, the validity of the data is not guaranteed while the ISM write operation is taking place. After the write operation is complete, the device will automatically enter the array read mode and an ACTIVE-READ will output valid data.

The following Table illustrates a command operation when $CKE_{n-1}$ and $CKE_n$ are high and the bank is changed.

TRUTH TABLE 5

Current State Bank n - Command to Bank m
(Notes 1–6)

| CURRENT STATE | CS# | RAS# | CAS# | WE# | COMMAND/ACTION | Notes |
|---|---|---|---|---|---|---|
| Any | H | X | X | X | COMMAND INHIBIT (NOP/continue previous operation) | |
| | L | H | H | H | NO OPERATION (NOP/continue previous operation | |
| Idle | X | X | X | X | Any Command Otherwise Allowed to Bank m | |
| Row Activating, Active, or Active | L | L | H | H | ACTIVE (Select and activate row) | |
| | L | H | L | H | READ (Select column and start READ burst) | |

TRUTH TABLE 5-continued

Current State Bank n - Command to Bank m
(Notes 1–6)

| CURRENT STATE | CS# | RAS# | CAS# | WE# | COMMAND/ACTION | Notes |
|---|---|---|---|---|---|---|
| Terminate | L | H | L | L | WRITE (Select column and start WRITE | |
| | L | L | H | L | ACTIVE TERMINATE | |
| | L | L | L | H | LOAD COMMAND REGISTER | |
| READ | L | L | H | H | ACTIVE (Select and activate row) | |
| | L | H | L | H | READ (Select column and start new READ burst) | |
| | L | H | L | L | WRITE (Select column and start WRITE) | |
| | L | L | H | L | ACTIVE TERMINATE | |
| | L | L | L | H | LOAD COMMAND REGISTER | |
| WRITE | L | L | H | H | ACTIVE (Select and activate row) | |
| | L | H | L | H | READ (Select column and start READ burst) | |
| | L | L | H | L | ACTIVE TERMINATE | |
| | L | H | H | L | BURST TERMINATE | |
| | L | L | L | H | LOAD COMMAND REGISTER | |

Notes for Truth Table 5:
1 This table applies $CKE_{n-1}$ was HIGH and $CKE_n$ is HIGH (see Truth Table 3).
2 This table describes alternate bank operation, except where noted; i.e., the current state is for bank n and the commands shown are those allowed to be issued to bank m (assuming that bank m is in such a state that the given command is allowable). Exceptions are covered in the notes below.
3 Current state definitions:
Idle: The bank is not in initialize, read, write mode and tRP has been met.
Row Active: A row in the bank has been activated and tRCD has been met. No data bursts/accesses and no register accesses are in progress.
Read: A READ burst has been initiated and has not yet terminated or been terminated.
Write: A WRITE operation has been initiated to the Internal State Machine and has not yet been completed.
4 LOAD MODE REGISTER command may only be issued when all banks are idle.
5 A BURST TERMINATE command cannot be issued to another bank; it applies to the bank represented by the current state only.
6 All states and sequences not shown are illegal or reserved.

Function Description

The synchronous flash memory incorporates a number of features to make it ideally suited for code storage and execute-in-place applications on an SDRAM bus. The memory array is segmented into individual erase blocks. Each block may be erased without affecting data stored in other blocks. These memory blocks are read, written and erased by issuing commands to the command execution logic 130 (CEL). The CEL controls the operation of the Internal State Machine 132 (ISM), which completely controls all ERASE NVMODE REGISTER, WRITE NVMODE REGISTER, WRITE, BLOCK ERASE, BLOCK PROTECT, DEVICE PROTECT, UNPROTECT ALL BLOCKS and VERIFY operations. The ISM 132 protects each memory location from over-erasure and optimizes each memory location for maximum data retention. In addition, the ISM greatly simplifies the control necessary for writing the device in-system or in an external programmer.

The synchronous flash memory is organized into 16 independently erasable memory blocks that allow portions of the memory to be erased without affecting the rest of the memory data. Any block may be hardware-protected against inadvertent erasure or writes. A protected block requires that the RP# pin be driven to VHH (a relatively high voltage) before being modified. The 256K-word blocks at locations 0 and 15 can have additional hardware protection. Once a PROTECT BLOCK command has been executed to these blocks, an UNPROTECT ALL BLOCKS command will unlock all blocks except the blocks at locations 0 and 15, unless the RP# pin is at VHH. This provides additional security for critical code during in-system firmware updates, should an unintentional power disruption or system reset occur.

Power-up initialization, ERASE, WRITE and PROTECT timings are simplified by using an ISM to control all programming algorithms in the memory array. The ISM ensures protection against over-erasure and optimizes write margin to each cell. During WRITE operations, the ISM automatically increments and monitors WRITE attempts, verifies write margin on each memory cell and updates the ISM Status Register. When a BLOCK ERASE operation is performed, the ISM automatically Overwrites the entire addressed block (eliminates over-erasure), increments and monitors ERASE attempts and sets bits in the ISM Status Register.

The 8-bit ISM Status Register 134 allows an external processor 200, or memory controller, to monitor the status of the ISM during WRITE, ERASE and PROTECT operations. One bit of the 8-bit Status Register (SR7) is set and cleared entirely by the ISM. This bit indicates whether the ISM is busy with an ERASE, WRITE or PROTECT task. Additional error information is set in three other bits (SR3, SR4 and SR5): write and protect block error, erase and unprotect all blocks error, and device protection error. Status register bits SR0, SR1 and SR2 provide details on the ISM operation underway. The user can monitor whether a device-level or bank-level ISM operation (including which bank is under ISM control) is underway. These six bits (SR3-SR5) must be cleared by the host system. The Status Register is describe in further detail below with reference to Table 3.

The CEL 130 receives and interprets commands to the device. These commands control the operation of the ISM and the read path (i.e., memory array, device configuration or Status Register). Commands may be issued to the CEL while the ISM is active.

To allow for maximum power conservation, the synchronous flash features a very low current, deep power-down mode. To enter this mode, the RP# pin 140 (reset/power-down) is taken to VSS±0.2V. To prevent an inadvertent RESET, RP# must be held at Vss for 100 ns prior to the device entering the reset mode. With RP# held at Vss, the device will enter the deep power-down mode. After the device enters the deep power-down mode, a transition from LOW to HIGH on RP# will result in a device power-up initialize sequence as outlined herein. Transitioning RP# from LOW to HIGH after entering the reset mode but prior to entering deep power-down mode requires a 1 $\mu$s delay prior to issuing an executable command. When the device enters the deep power-down mode, all buffers excluding the RP# buffer are disabled and the current draw is low, for example, a maximum of 50 $\mu$A at 3.3V VCC. The input to RP# must remain at Vss during deep power-down. Entering the RESET mode clears the Status Register 134 and sets the ISM 132 to the array read mode.

The synchronous flash memory array architecture is designed to allow sectors to be erased without disturbing the rest of the array. The array is divided into 16 addressable "blocks" that are independently erasable. By erasing blocks rather than the entire array, the total device endurance is enhanced, as is system flexibility. Only the ERASE and BLOCK PROTECT functions are block oriented. The 16 addressable blocks are equally divided into four banks 104, 106, 108 and 110 of four blocks each. The four banks have simultaneous read-while-write functionality. An ISM WRITE or ERASE operation to any bank can occur simultaneously to a READ operation to any other bank. The Status Register 134 may be polled to determine which bank is under ISM operation. The synchronous flash memory has a single background operation ISM to control power-up initialization, ERASE, WRITE, and PROTECT operations. Only one ISM operation can occur at any time; however, certain other commands, including READ operations, can be performed while the ISM operation is taking place. An operational command controlled by the ISM is defined as either a bank-level operation or a device-level operation. WRITE and ERASE are bank-level ISM operations. After an ISM bank operation has been initiated, a READ to any location in the bank may output invalid data, whereas a READ to any other bank will read the array. A READ STATUS REGISTER command will output the contents of the Status Register 134. The ISM status bit will indicate when the ISM operation is complete (SR7=1). When the ISM operation is complete, the bank will automatically enter the array read mode. ERASE NVMODE REGISTER, WRITE NVMODE REGISTER, BLOCK PROTECT, DEVICE PROTECT, and UNPROTECT ALL BLOCKS are device-level ISM operations. Once an ISM device-level operation has been initiated, a READ to any bank will output the contents of the array. A READ STATUS REGISTER command may be issued to determine completion of the ISM operation. When SR7=1, the ISM operation will be complete and a subsequent ISM operation may be initiated. Any block may be protected from unintentional ERASE or WRITE with a hardware circuit that requires the RP# pin be driven to VHH before a WRITE or ERASE is commenced, as explained below.

Any block may be hardware-protected to provide extra security for the most sensitive portions of the firmware. During a WRITE or ERASE of a hardware protected block, the RP# pin must be held at VHH until the WRITE or ERASE is completed. Any WRITE or ERASE attempt on a protected block without RP#=VHH will be prevented and will result in a write or erase error. The blocks at locations 0 and 15 can have additional hardware protection to prevent an inadvertent WRITE or ERASE operation. In this embodiment, these blocks cannot be software-unlocked through an UNPROTECT ALL BLOCKS command unless RP#=VHH. The protection status of any block may be checked by reading its block protect bit with a READ STATUS REGISTER command. Further, to protect a block, a three-cycle command sequence must be issued with the block address.

The synchronous flash memory can feature three different types of READs. Depending on the mode, a READ operation will produce data from the memory array, status register, or one of the device configuration registers. A READ to the device configuration register or the Status Register must be preceded by an LCR-ACTIVE cycle and burst length of data out will be defined by the mode register settings. A subsequent READ or a READ not preceded by an LCR-ACTIVE cycle will read the array. However, several differences exist and are described in the following section.

A READ command to any bank outputs the contents of the memory array. While a WRITE or ERASE ISM operation is taking place, a READ to any location in the bank under ISM control may output invalid data. Upon exiting a RESET operation, the device will automatically enter the array read mode.

Performing a READ of the Status Register 134 requires the same input sequencing as when reading the array, except that an LCR READ STATUS REGISTER (70H) cycle must precede the ACTIVE READ cycles. The burst length of the Status Register data-out is defined by the Mode Register 148. The Status Register contents are updated and latched on the next positive clock edge subject to CAS latencies. The device will automatically enter the array read mode for subsequent READs.

Reading any of the Device Configuration Registers 136 requires the same input sequencing as when reading the Status Register except that specific addresses must be issued. WE# must be HIGH, and DQM and CS# must be LOW. To read the manufacturer compatibility ID, addresses must be at 000000H, and to read the device ID, addresses must be at 000001H. Any of the block protect bits is read at the third address location within each erase block (xx0002H), while the device protect bit is read from location 000003H.

The DQ pins are used either to input data to the array. The address pins are used either to specify an address location or to input a command to the CEL during the LOAD COMMAND REGISTER cycle. A command input issues an 8-bit command to the CEL to control the operation mode of the device. A WRITE is used to input data to the memory array. The following section describes both types of inputs.

To perform a command input, DQM must be LOW, and CS# and WE# must be LOW. Address pins or DQ pins are used to input commands. Address pins not used for input commands are "Don't Care" and must be held stable. The 8-bit command is input on DQ0–DQ7 or A0–A7 and is latched on the positive clock edge.

A WRITE to the memory array sets the desired bits to logic 0s but cannot change a given bit to a logic 1 from a logic 0. Setting any bits to a logic 1 requires that the entire block be erased. To perform a WRITE, DQM must be LOW, CS# and WE# must be LOW, and VCCP must be tied to VCC. Writing to a protected block also requires that the RP# pin be brought to VHH. A0–A11 provide the address to be written, while the data to be written to the array is input on the DQ pins. The data and addresses are latched on the rising edge of the clock. A WRITE must be preceded by a WRITE SETUP command.

To simplify the writing of the memory blocks, the synchronous flash incorporates an ISM that controls all internal algorithms for the WRITE and ERASE cycles. An 8-bit command set is used to control the device. See Truth Tables 1 and 2 for a list of the valid commands.

The 8-bit ISM Status Register 134 (see Table 3) is polled to check for ERASE NVMODE REGISTER, WRITE NVMODE REGISTER, WRITE, ERASE, BLOCK PROTECT, DEVICE PROTECT or UNPROTECT ALL BLOCKS completion or any related errors. Completion of an ISM operation can be monitored by issuing a READ STATUS REGISTER (70H) command. The contents of the Status Register will be output to DQ0–DQ7 and updated on the next positive clock edge (subject to CAS latencies) for a fixed burst length as defined by the mode register settings. The ISM operation will be complete when SR7=1. All of the defined bits are set by the ISM, but only the ISM status bit is reset by the ISM. The erase/unprotect block, write/protect block, device protection must be cleared using a CLEAR STATUS REGISTER (50H) command. This allows the user to choose when to poll and clear the Status Register. For example, a host system may perform multiple WRITE operations before checking the Status Register instead of checking after each individual WRITE. Asserting the RP# signal or powering down the device will also clear the Status Register.

TABLE 3

STATUS REGISTER

| STATUS BIT# | STATUS REGISTER BIT | DESCRIPTION |
| --- | --- | --- |
| SR7 | ISM STATUS<br>1 = Ready<br>0 = Busy | The ISMS bit displays the active status of the state machine when performing WRITE or BLOCK ERASE. The controlling logic polls this bit to determine when the erase and write status bits are valid. |
| SR6 | RESERVED | Reserved for future use. |
| SR5 | ERASE/UNPROTECT BLOCK STATUS<br>1 = BLOCK ERASE or BLOCK UNPROTECT error<br>0 = Successful BLOCK ERASE or UNPROTECT | ES is set to 1 after the maximum number of ERASE cycles is executed by the ISM without a successful verify. This bit is also set to 1 if a BLOCK UNPROTECT operation is unsuccessful. ES is only cleared by a CLEAR STATUS REGISTER command or by a RESET. |
| SR4 | WRITE/PROTECT BLOCK STATUS<br>1 = WRITE or BLOCK PROTECT error<br>0 = Successful WRITE or BLOCK PROTECT | WS is set to 1 after the maximum number of WRITE cycles is executed by the ISM without a successful verify. This bit is also set to 1 if a BLOCK or DEVICE PROTECT operation is unsuccessful. WS is only cleared by a CLEAR STATUS REGISTER command or by a RESET. |
| SR2<br>SR1 | BANKA1 ISM STATUS<br>BANKA0 ISM STATUS | When SR0 = 0, the bank under ISM control can be decoded from BA0, BA1: [0,0] Bank0; [0,1] Bank1; [1,0] Bank2; [1,1] Bank3. |
| SR3 | DEVICE PROTECT STATUS<br>1 = Device protected, invalid operation attempted<br>0 = Device unprotected or RP# condition met | DPS is set to 1 if an invalid WRITE, ERASE, PROTECT BLOCK, PROTECT DEVICE or UNPROTECT ALL BLOCKS is attempted. After one of these commands is issued, the condition of RP#, the block protect bit and the device protect bit are compared to determine if the desired operation is allowed. Must be cleared by CLEAR STATUS REGISTER or by a RESET. |
| SR0 | DEVICE/BANK ISM STATUS<br>1 = Device level ISM operation<br>0 = Bank level ISM operation | DBS is set to 1 if the ISM operation is a device-level operation. A valid READ to any bank of the array can immediately follow the registration of a device-level ISM WRITE operation. When DBS is set to 0, the ISM operation is a bank-level operation. A READ to the bank under ISM control may result in invalid data. SR2 and SR3 can be decoded to determine which bank is under ISM control. |

The device ID, manufacturer compatibility ID, device protection status and block protect status can all be read by issuing a READ DEVICE CONFIGURATION (90H) command. To read the desired register, a specific address must be asserted. See Table 4 for more details on the various device configuration registers 136.

TABLE 4

DEVICE CONFIGURATION

| DEVICE CON-FIGURATION | ADDRESS | DATA | CONDITION | Notes |
|---|---|---|---|---|
| Manufacturer Compatibility | 000000H | 2CH | Manufacturer compatibility read | 1 |
| Device ID | 000001H | D3H | Device ID read | 1 |
| Block Protect Bit | xx0002H | DQ0 = 1 | Block protected | 2, 3 |
|  | xx0002H | DQ0 = 0 | Block unprotected |  |
| Device Protect Bit | 000003H | DQ0 = 1 | Block protect modification prevented | 3 |
|  | 000003H | DQ0 = 0 | Block protect modification enabled |  |

Notes for Table 4:
1 DQ8–DQ15 are "Don't Care."
2 Address to read block protect bit is always the third location within each block.
3 DQ1–DQ7 are reserved, DQ8–DQ15 are "Don't Care."

Commands can be issued to bring the device into different operational modes. Each mode has specific operations that can be performed while in that mode. Several modes require a sequence of commands to be written before they are reached. The following section describes the properties of each mode, and Truth Tables 1 and 2 list all command sequences required to perform the desired operation. Read-while-write functionality allows a background operation write or erase to be performed on any bank while simultaneously reading any other bank. For a write operation, the LCR-ACTIVE-WRITE command sequences in Truth Table 2 must be completed on consecutive clock cycles. However, to simplify a synchronous flash controller operation, an unlimited number of NOPs or COMMAND INHIBITs can be issued throughout the command sequence. For additional protection, these command sequences must have the same bank address for the three cycles. If the bank address changes during the LCR-ACTIVE-WRITE command sequence, or if the command sequences are not consecutive (other than NOPs and COMMAND INHIBITs, which are permitted), the write and erase status bits (SR4 and SR5) will be set and the operation prohibited.

Upon power-up and prior to issuing any operational commands to the device, the synchronous flash is initialized. After power is applied to VCC, VCCQ and VCCP (simultaneously), and the clock is stable, RP# is transitioned from LOW to HIGH. A delay (in one embodiment a 100 μs delay) is required after RP# transitions HIGH in order to complete internal device initialization. The device is in the array read mode at the completion of device initialization, and an executable command can be issued to the device.

To read the device ID, manufacturer compatibility ID, device protect bit and each of the block protect bits, a READ DEVICE CONFIGURATION (90H) command is issued. While in this mode, specific addresses are issued to read the desired information. The manufacturer compatibility ID is read at 000000H; the device ID is read at 000001H. The manufacturer compatibility ID and device ID are output on DQ0–DQ7. The device protect bit is read at 000003H; and each of the block protect bits is read at the third address location within each block (xx0002H). The device and block protect bits are output on DQ0.

Three consecutive commands on consecutive clock edges are needed to input data to the array (NOPs and Command Inhibits are permitted between cycles). In the first cycle, a LOAD COMMAND REGISTER command is given with WRITE SETUP (40H) on A0–A7, and the bank address is issued on BA0, BA1. The next command is ACTIVE, which activates the row address and confirms the bank address. The third cycle is WRITE, during which the starting column, the bank address, and data are issued. The ISM status bit will be set on the following clock edge (subject to CAS latencies). While the ISM executes the WRITE, the ISM status bit (SR7) will be at 0. A READ operation to the bank under ISM control may produce invalid data. When the ISM status bit (SR7) is set to a logic 1, the WRITE has been completed, and the bank will be in the array read mode and ready for an executable command. Writing to hardware-protected blocks also requires that the RP# pin be set to VHH prior to the third cycle (WRITE), and RP# must be held at VHH until the ISM WRITE operation is complete. The write and erase status bits (SR4 and SR5) will be set if the LCR-ACTIVE-WRITE command sequence is not completed on consecutive cycles or the bank address changes for any of the three cycles. After the ISM has initiated the WRITE, it cannot be aborted except by a RESET or by powering down the part. Doing either during a WRITE may corrupt the data being written.

Executing an ERASE sequence will set all bits within a block to logic 1. The command sequence necessary to execute an ERASE is similar to that of a WRITE. To provide added security against accidental block erasure, three consecutive command sequences on consecutive clock edges are required to initiate an ERASE of a block. In the first cycle, LOAD COMMAND REGISTER is given with ERASE SETUP (20H) on A0–A7, and the bank address of the block to be erased is issued on BA0, BA1. The next command is ACTIVE, where A10, A11, BA0, BA1 provide the address of the block to be erased. The third cycle is WRITE, during which ERASE CONFRIM (D0H) is given on DQ0–DQ7 and the bank address is reissued. The ISM status bit will be set on the following clock edge (subject to CAS latencies). After ERASE CONFIRM (D0H) is issued, the ISM will start the ERASE of the addressed block. Any READ operation to the bank where the addressed block resides may output invalid data. When the ERASE operation is complete, the bank will be in the array read mode and ready for an executable command. Erasing hardware-protected blocks also requires that the RP# pin be set to VHH prior to the third cycle (WRITE), and RP# must be held at VHH until the ERASE is completed (SR7=1). If the LCR-ACTIVE-WRITE command sequence is not completed on consecutive cycles (NOPs and COMMAND INHIBITs are permitted between cycles) or the bank address changes for one or more of the command cycles, the write and erase status bits (SR4 and SR5) will be set and the operation is prohibited.

The contents of the Mode Register 148 may be copied into the NVMode Register 147 with a WRITE NVMODE REGISTER command. Prior to writing to the NVMode Register, an ERASE NVMODE REGISTER command sequence must be completed to set all bits in the NVMode Register to logic 1. The command sequence necessary to execute an ERASE NVMODE REGISTER and WRITE NVMODE REGISTER is similar to that of a WRITE. See Truth Table 2 for more information on the LCR-ACTIVE-WRITE commands necessary to complete ERASE NVMODE REGISTER and WRITE NVMODE REGISTER. After the WRITE cycle of the ERASE NVMODE REGISTER or WRITE NVMODE REGISTER command sequence has been registered, a READ command may be issued to the array. A new WRITE operation will not be permitted until the current ISM operation is complete and SR7=1.

Executing a BLOCK PROTECT sequence enables the first level of software/hardware protection for a given block. The memory includes a 16-bit register that has one bit corresponding to the 16 protectable blocks. The memory also has a register to provide a device bit used to protect the entire device from write and erase operations. The command sequence necessary to execute a BLOCK PROTECT is similar to that of a WRITE. To provide added security against accidental block protection, three consecutive command cycles are required to initiate a BLOCK PROTECT. In the first cycle, a LOAD COMMAND REGISTER is issued with a PROTECT SETUP (60H) command on A0–A7, and the bank address of the block to be protected is issued on BA0, BA1. The next command is ACTIVE, which activates a row in the block to be protected and confirms the bank address. The third cycle is WRITE, during which BLOCK PROTECT CONFIRM (01H) is issued on DQ0–DQ7, and the bank address is reissued. The ISM status bit will be set on the following clock edge (subject to CAS latencies). The ISM will then begin the PROTECT operation. If the LCR-ACTIVE-WRITE is not completed on consecutive cycles (NOPs and COMMAND INHIBITs are permitted between cycles) or the bank address changes, the write and erase status bits (SR4 and SR5) will be set and the operation is prohibited. When the ISM status bit (SR7) is set to a logic 1, the PROTECT has been completed, and the bank will be in the array read mode and ready for an executable command. Once a block protect bit has been set to a 1 (protected), it can only be reset to a 0 if the UNPROTECT ALL BLOCKS command. The UNPROTECT ALL BLOCKS command sequence is similar to the BLOCK PROTECT command; however, in the third cycle, a WRITE is issued with a UNPROTECT ALL BLOCKS CONFIRM (D0H) command and addresses are "Don't Care." For additional information, refer to Truth Table 2. The blocks at locations 0 and 15 have additional security. Once the block protect bits at locations 0 and 15 have been set to a 1 (protected), each bit can only be reset to a 0 if RP# is brought to VHH prior to the third cycle of the UNPROTECT operation, and held at VHH until the operation is complete (SR7=1). Further, if the device protect bit is set, RP# must be brought to VHH prior to the third cycle and held at VHH until the BLOCK PROTECT or UNPROTECT ALL BLOCKS operation is complete. To check a block's protect status, a READ DEVICE CONFIGURATION (90H) command may be issued.

Executing a DEVICE PROTECT sequence sets the device protect bit to a 1 and prevents a block protect bit modification. The command sequence necessary to execute a DEVICE PROTECT is similar to that of a WRITE. Three consecutive command cycles are required to initiate a DEVICE PROTECT sequence. In the first cycle, LOAD COMMAND REGISTER is issued with a PROTECT SETUP (60H) on A0–A7, and a bank address is issued on BA0, BA1. The bank address is "Don't Care" but the same bank address must be used for all three cycles. The next command is ACTIVE. The third cycle is WRITE, during which a DEVICE PROTECT (F1H) command is issued on DQ0–DQ7, and RP# is brought to VHH. The ISM status bit will be set on the following clock edge (subject to CAS latencies). An executable command can be issued to the device. RP# must be held at VHH until the WRITE is completed (SR7=1). A new WRITE operation will not be permitted until the current ISM operation is complete. Once the device protect bit is set, it cannot be reset to a 0. With the device protect bit set to a 1, BLOCK PROTECT or BLOCK UNPROTECT is prevented unless RP# is at VHH during either operation. The device protect bit does not affect WRITE or ERASE operations. Refer to Table 5 for more information on block and device protect operations.

TABLE 5

PROTECT OPERATIONS TRUTH TABLE[1]

| FUNCTION | RP# | CS# | DQM | WE# | Address | VccP | DQ0–DQ7[5] |
|---|---|---|---|---|---|---|---|
| DEVICE UNPROTECTED[2] | | | | | | | |
| PROTECT SETUP | H | L | H | L | 60H | X | X |
| PROTECT BLOCK[3] | H | L | H | L | BA | H | 01H |
| PROTECT DEVICE[3] | $V_{HH}$ | L | H | L | X | X | F1H |
| UNPROTECT ALL BLOCKS[3, 4] | H/$V_{HH}$ | L | H | L | X | H | D0H |
| DEVICE PROTECTED[2] | | | | | | | |
| PROTECT SETUP[4] | H or $V_{HH}$ | L | H | L | 60H | X | X |
| PROTECT BLOCK[3, 4] | $V_{HH}$ | L | H | L | BA | H | 01H |
| UNPROTECT ALL BLOCKS[3, 4] | $V_{HH}$ | L | H | L | X | H | D0H |

Notes for Table 5:
[1]L = $V_{IL}$ (LOW), H = $V_{IH}$ (HIGH), X = $V_{IL}$ or $V_{IH}$ ("Don't Care").
[2]BA = Block Address.
[3]Operation must be preceded by PROTECT SETUP command.
[4]RP# = $V_{IH}$ (3 V), all blocks except the top and bottom blocks will unlock; RP# = $V_{HH}$ (5 V), all blocks will unlock.
[5]DQ8–DQ15 are "Don't Care."

After the ISM status bit (SR7) has been set, the device/bank (SR0), device protect (SR3), bankA0 (SR1), bankA1 (SR2), write/protect block (SR4) and erase/unprotect (SR5) status bits may be checked. If one or a combination of SR3, SR4, SR5 status bits has been set, an error has occurred during operation. The ISM cannot reset the SR3, SR4 or SR5 bits. To clear these bits, a CLEAR STATUS REGISTER (50H) command must be given. Table 6 lists the combinations of errors.

TABLE 6

STATUS REGISTER ERROR DECODE[1]

STATUS BITS

| SR5 | SR4 | SR3 | ERROR DESCRIPTION[2] |
|---|---|---|---|
| 0 | 0 | 0 | No errors |
| 0 | 1 | 0 | WRITE, BLOCK PROTECT or DEVICE PROTECT error |
| 0 | 1 | 1 | Invalid BLOCK PROTECT or DEVICE PROTECT, RP# not valid ($V_{HH}$) |
| 0 | 1 | 1 | Invalid BLOCK or DEVICE PROTECT, RP# not valid |
| 1 | 0 | 0 | ERASE or ALL BLOCK UNPROTECT error |
| 1 | 0 | 1 | Invalid ALL BLOCK UNPROTECT, RP# not valid ($V_{HH}$) |
| 1 | 1 | 0 | Command sequencing error |

Notes for Table 6:
[1]SR0–SR5 must be cleared using CLEAR STATUS REGISTER.
[2]Assumes that SR3, SR4, SR5 reflect non-cumulative results.

The synchronous flash memory is designed and fabricated to meet advanced code and data storage requirements. To ensure this level of reliability, VCCP must be tied to Vcc during WRITE or ERASE cycles. Operation outside these limits may reduce the number of WRITE and ERASE cycles that can be performed on the device. Each block is designed and processed for a minimum of 100,000-WRITE/ERASE-cycle endurance.

The synchronous flash memory offers several power-saving features that may be utilized in the array read mode to conserve power. A deep power-down mode is enabled by bringing RP# to VSS±0.2V. Current draw (ICC) in this mode is low, such as a maximum of 50 μA. When CS# is HIGH, the device will enter the active standby mode. In this mode the current is also low, such as a maximum ICC current of 30 mA. If CS# is brought HIGH during a write, erase, or protect operation, the ISM will continue the WRITE operation, and the device will consume active IccP power until the operation is completed.

Figure 16:
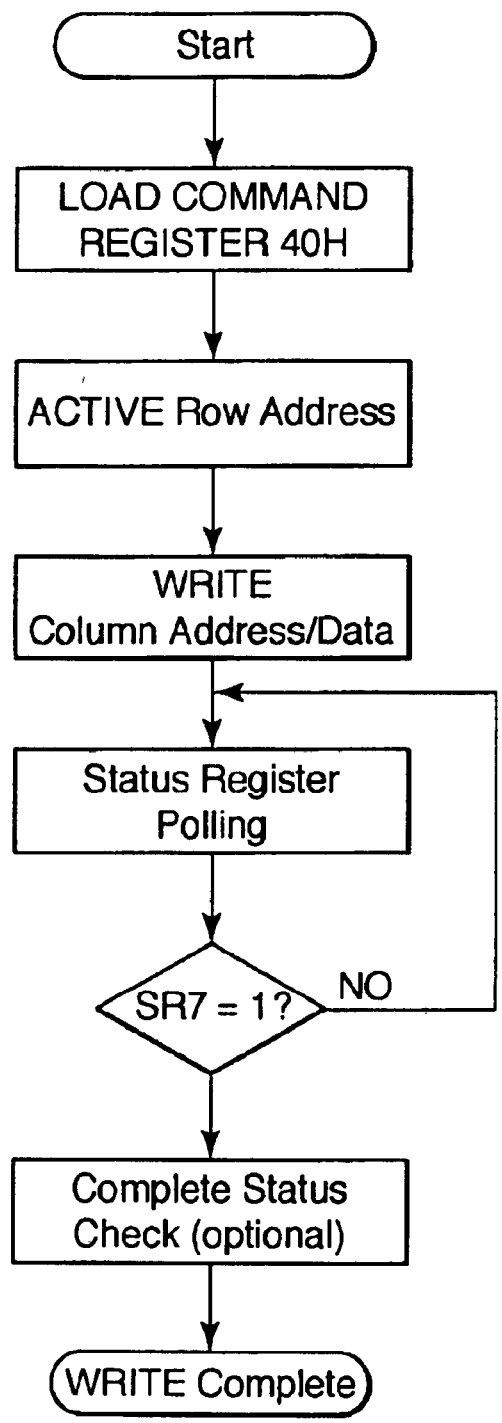
FIG. 16 is a flow chart of a self-timed write sequence according to one embodiment of the present invention.

Referring to FIG. 16, a flow chart of a self-timed write sequence according to one embodiment of the present invention is described. The sequence includes loading the command register (code 40H), receiving an active command and a row address, and receiving a write command and a column address. The sequence then provides for a status register polling to determine if the write is complete. The polling monitors status register bit 7 (SR7) to determine if it is set to a 1. An optional status check can be included. When the write is completed, the array is placed in the array read mode.

Figure 17:
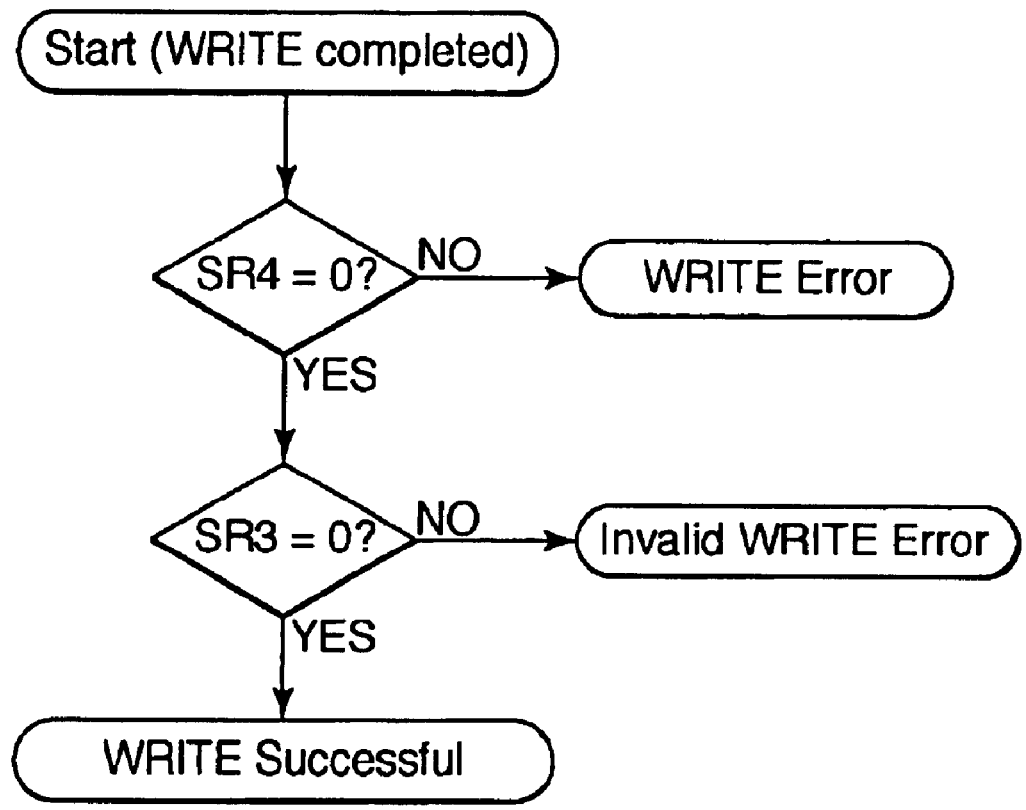
FIG. 17 is a flow chart of a complete write status-check sequence according to one embodiment of the present invention.

Referring to FIG. 17, a flow chart of a complete write status-check sequence according to one embodiment of the present invention is provided. The sequence looks for status register bit 4 (SR4) to determine if it is set to a 0. If SR4 is a 1, there was an error in the write operation. The sequence also looks for status register bit 3 (SR3) to determine if it is set to a 0. If SR3 is a 1, there was an invalid write error during the write operation.

Figure 18:
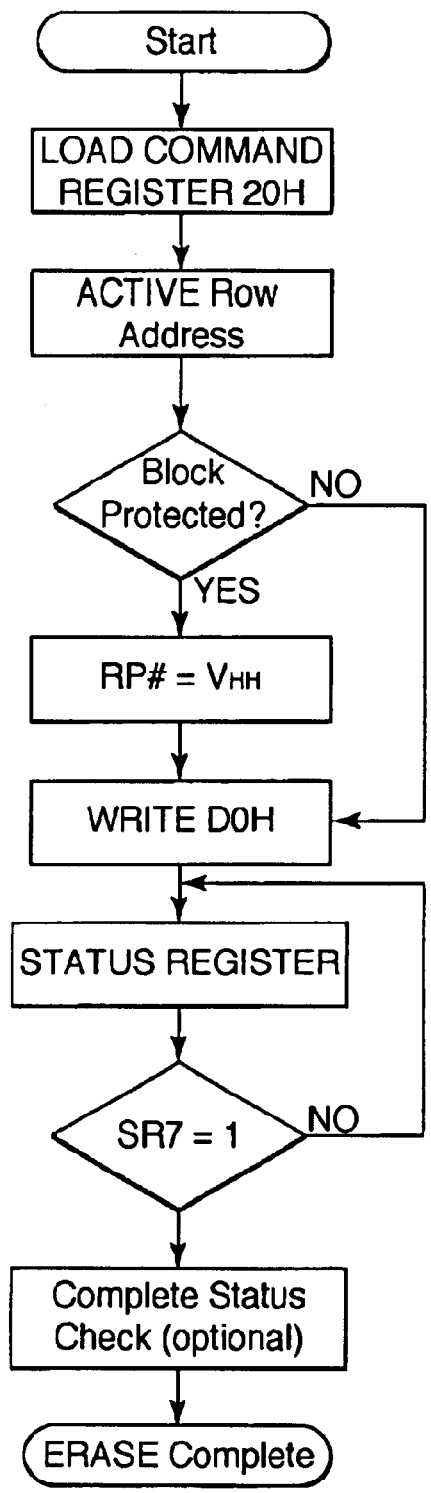
FIG. 18 is a flow chart of a self-timed block erase sequence according to one embodiment of the present invention.

Referring to FIG. 18, a flow chart of a self-timed block erase sequence according to one embodiment of the present invention is provided. The sequence includes loading the command register (code 20H), and receiving an active command and a row address. The memory then determines if the block is protected. If it is not protected, the memory performs a write operation (D0H) to the block and monitors the status register for completion. An optional status check can be performed and the memory is placed in an array read mode. If the block is protected, the erase is not allowed unless the RP# signal is at an elevated voltage (VHH).

Figure 19:
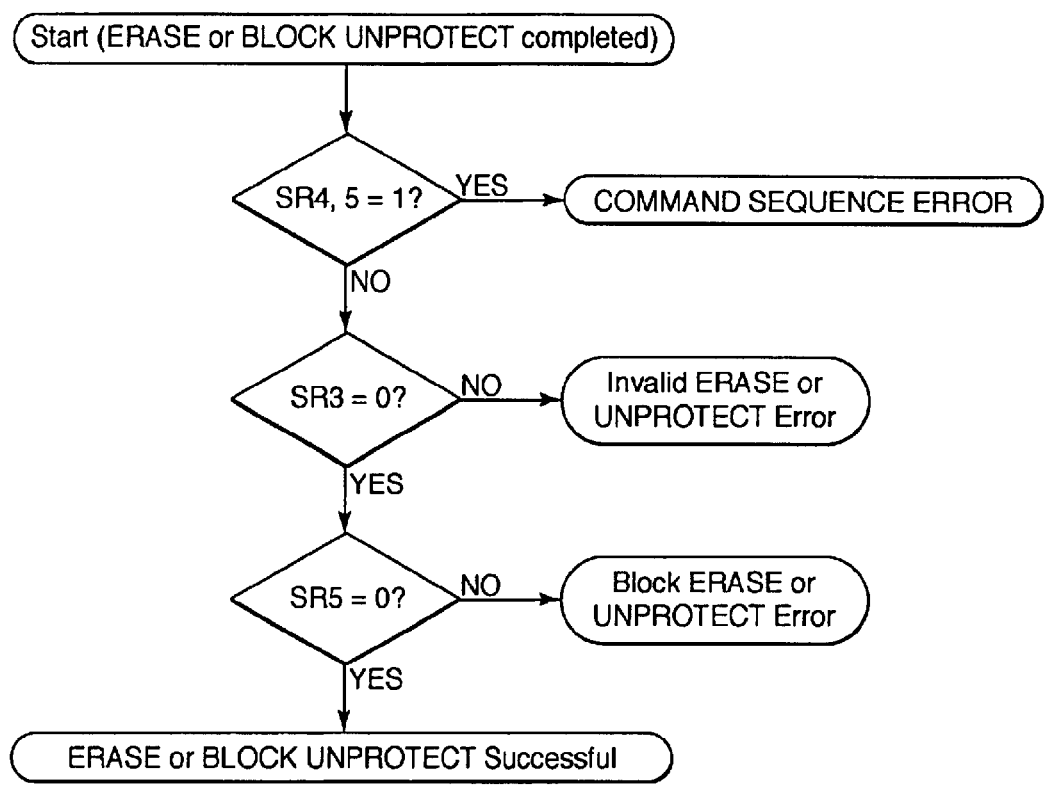
FIG. 19 is a flow chart of a complete block erase status-check sequence according to one embodiment of the present invention.

FIG. 19 illustrates a flow chart of a complete block erase status-check sequence according to one embodiment of the present invention. The sequence monitors the status register to determine if a command sequence error occurred (SR4 or SR5=1). If SR3 is set to a 1, an invalid erase or unprotect error occurred. Finally, a block erase or unprotect error happened if SR5 is set to a 1.

Figure 20:
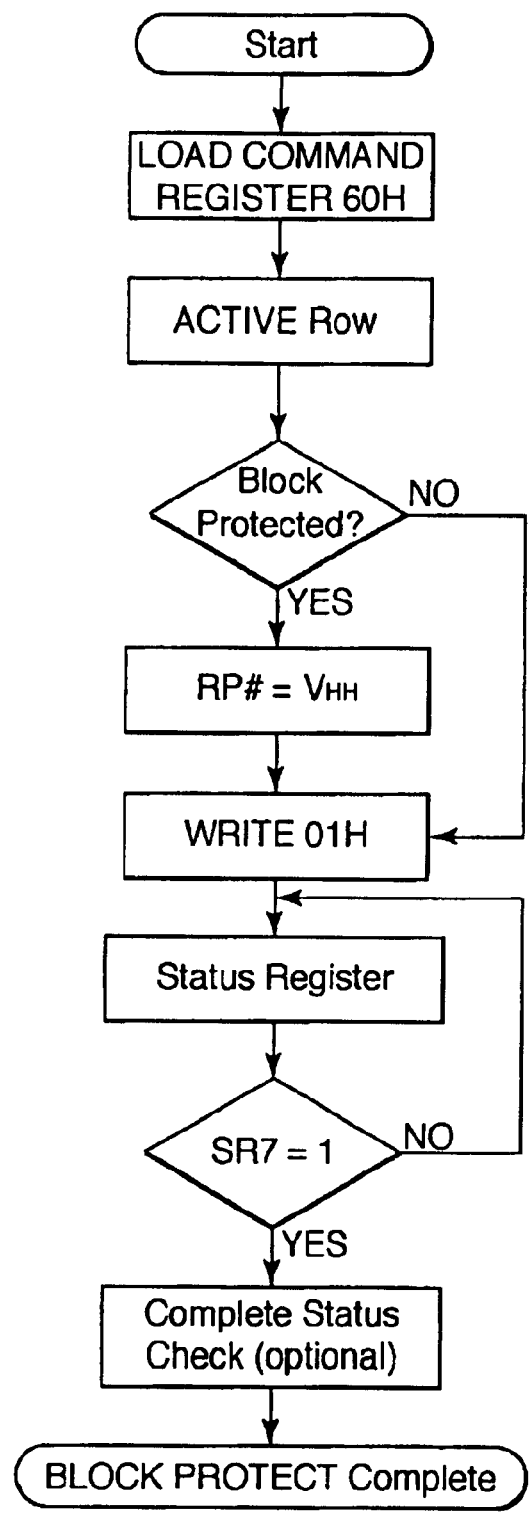
FIG. 20 is a flow chart of a block protect sequence according to one embodiment of the present invention.

FIG. 20 is a flow chart of a block protect sequence according to one embodiment of the present invention. The sequence includes loading the command register (code 60H), and receiving an active command and a row address. The memory then determines if the block is protected. If it is not protected, the memory performs a write operation (01H) to the block and monitors the status register for completion. An optional status check can be performed and the memory is placed in an array read mode. If the block is protected, the erase is not allowed unless the RP# signal is at an elevated voltage (VHH).

Figure 21:
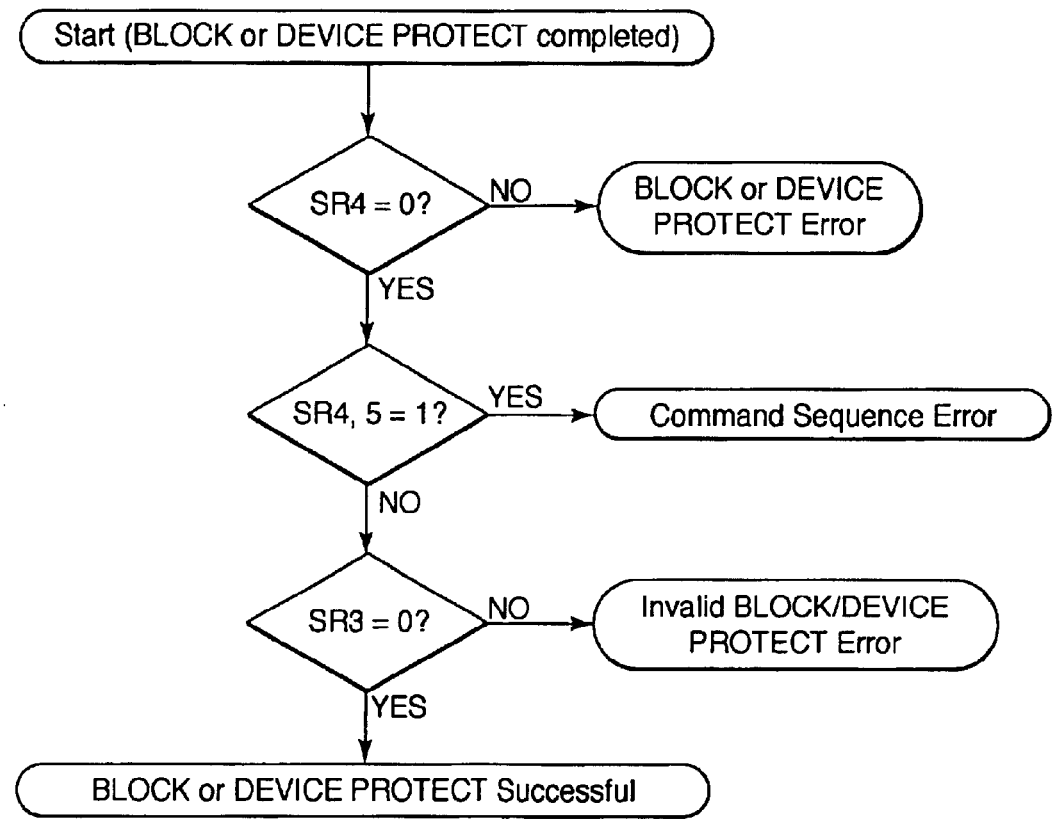
FIG. 21 is a flow chart of a complete block status-check sequence according to one embodiment of the present invention.

Referring to FIG. 21, a flow chart of a complete block status-check sequence according to one embodiment of the present invention is provided. The sequence monitors the status register bits 3, 4 and 5 to determine of errors were detected.

Figure 22:
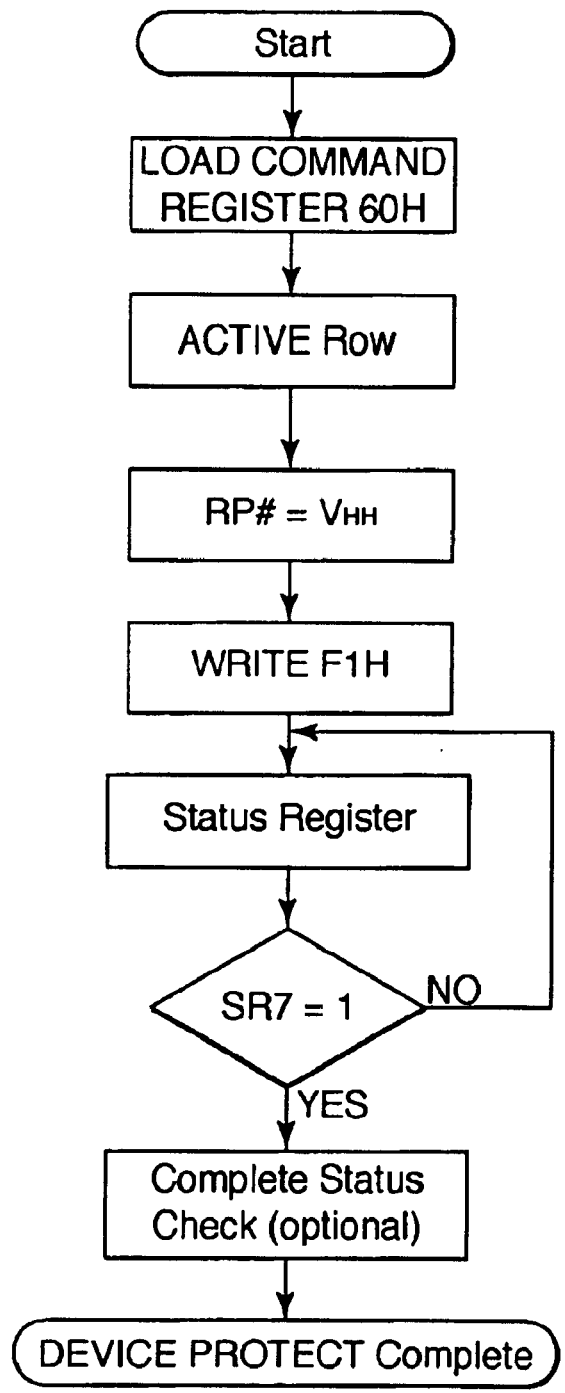
FIG. 22 is a flow chart of a device protect sequence according to one embodiment of the present invention.

FIG. 22 is a flow chart of a device protect sequence according to one embodiment of the present invention. The sequence includes loading the command register (code 60H), and receiving an active command and a row address. The memory then determines if RP# is at VHH. The memory performs a write operation (F1H) and monitors the status register for completion. An optional status check can be performed and the memory is placed in an array read mode.

Figure 23:
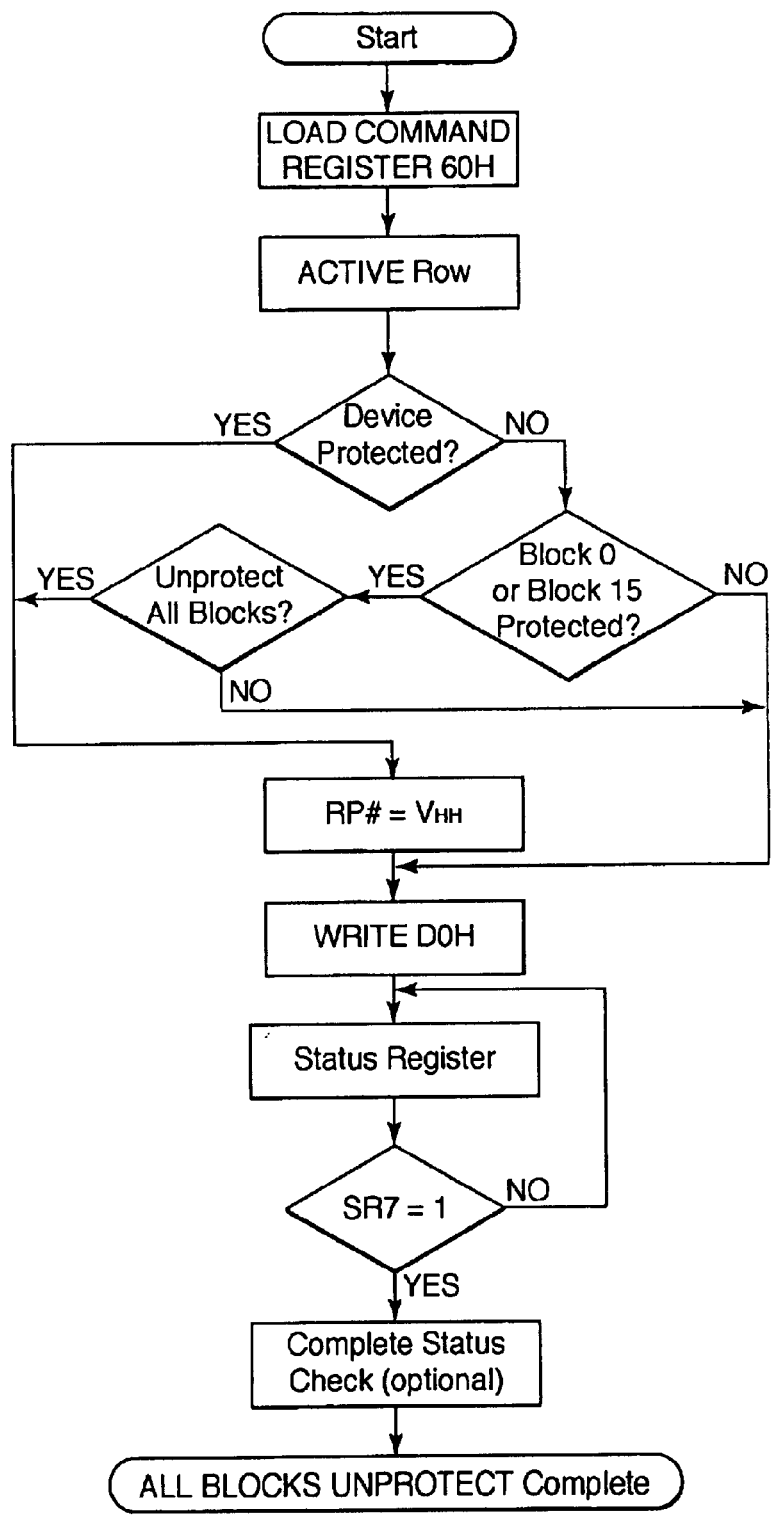
FIG. 23 is a flow chart of a block unprotect sequence according to one embodiment of the present invention.

FIG. 23 is a flow chart of a block unprotect sequence according to one embodiment of the present invention. The sequence includes loading the command register (code 60H), and receiving an active command and a row address. The memory then determines if the memory device is protected. If it is not protected, the memory determines if the boot locations (blocks 0 and 15) are protected. If none of the blocks are protected the memory performs a write operation (D0H) to the block and monitors the status register for completion. An optional status check can be performed and the memory is placed in an array read mode. If the device is protected, the erase is not allowed unless the RP# signal is at an elevated voltage (VHH). Likewise, if the boot locations are protected, the memory determines if all blocks should be unprotected.

Figure 24:
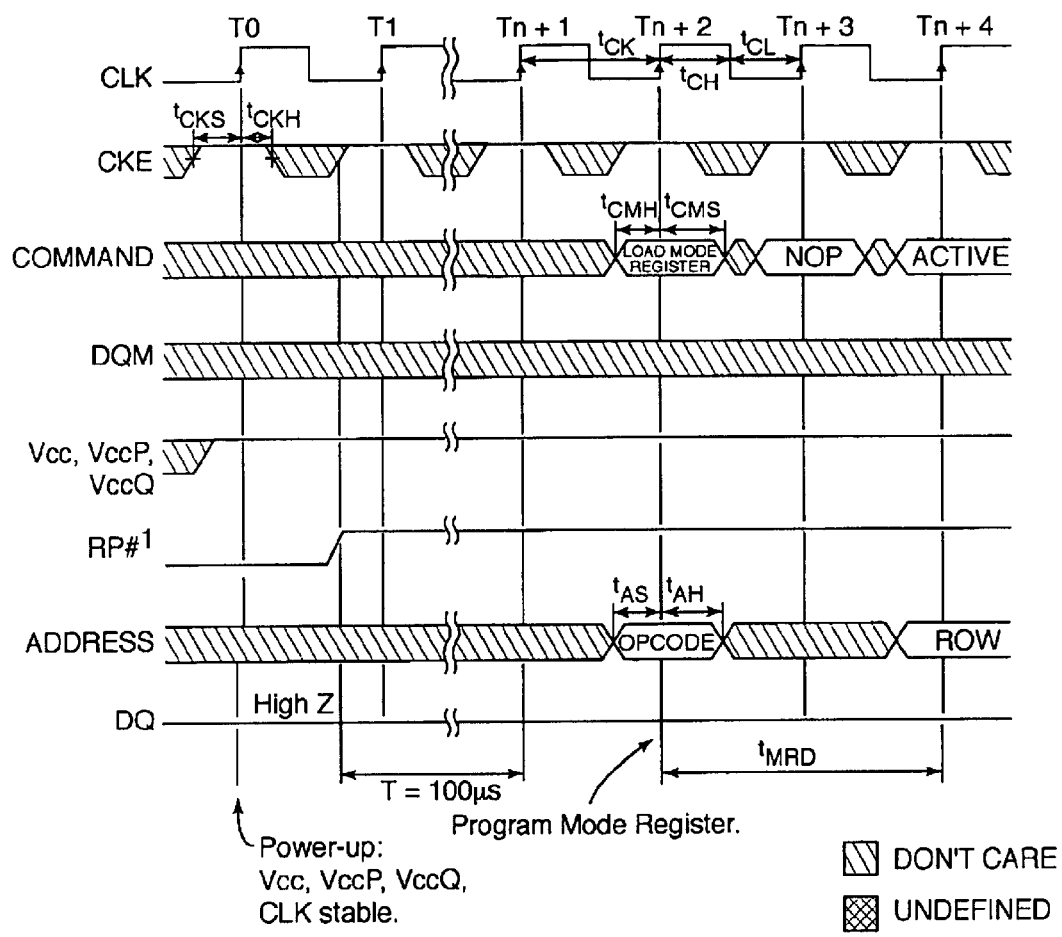
FIG. 24 illustrates the timing of an initialize and load mode register operation.

FIG. 24 illustrates the timing of an initialize and load mode register operation. The mode register is programmed by providing a load mode register command and providing operation code (opcode) on the address lines. The opcode is loaded into the mode register. As explained above, the contents of the non-volatile mode register are automatically loaded into the mode register upon power-up and the load mode register operation may not be needed.

Figure 25:
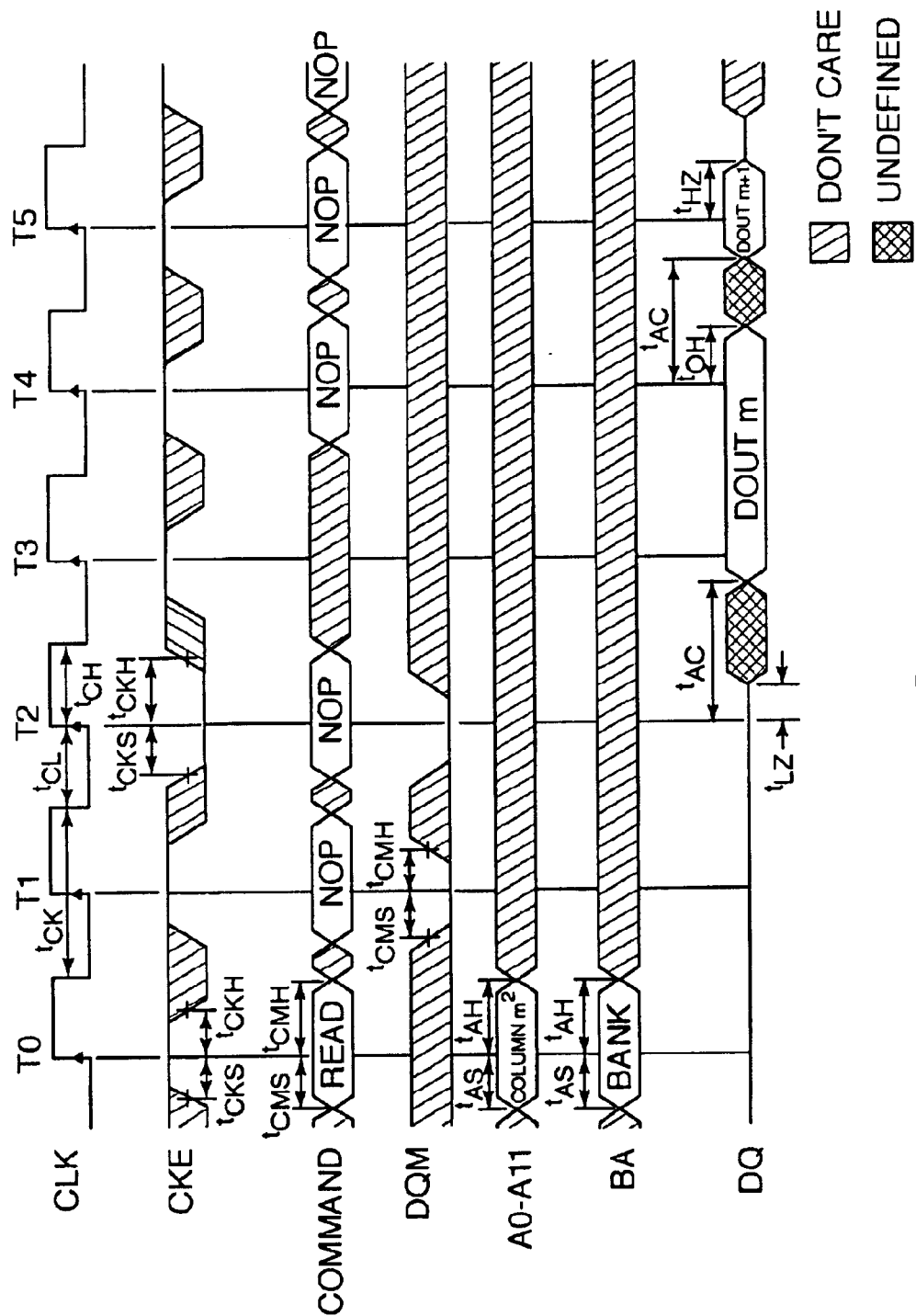
FIG. 25 illustrates the timing of a clock suspend mode operation.
Figure 26:
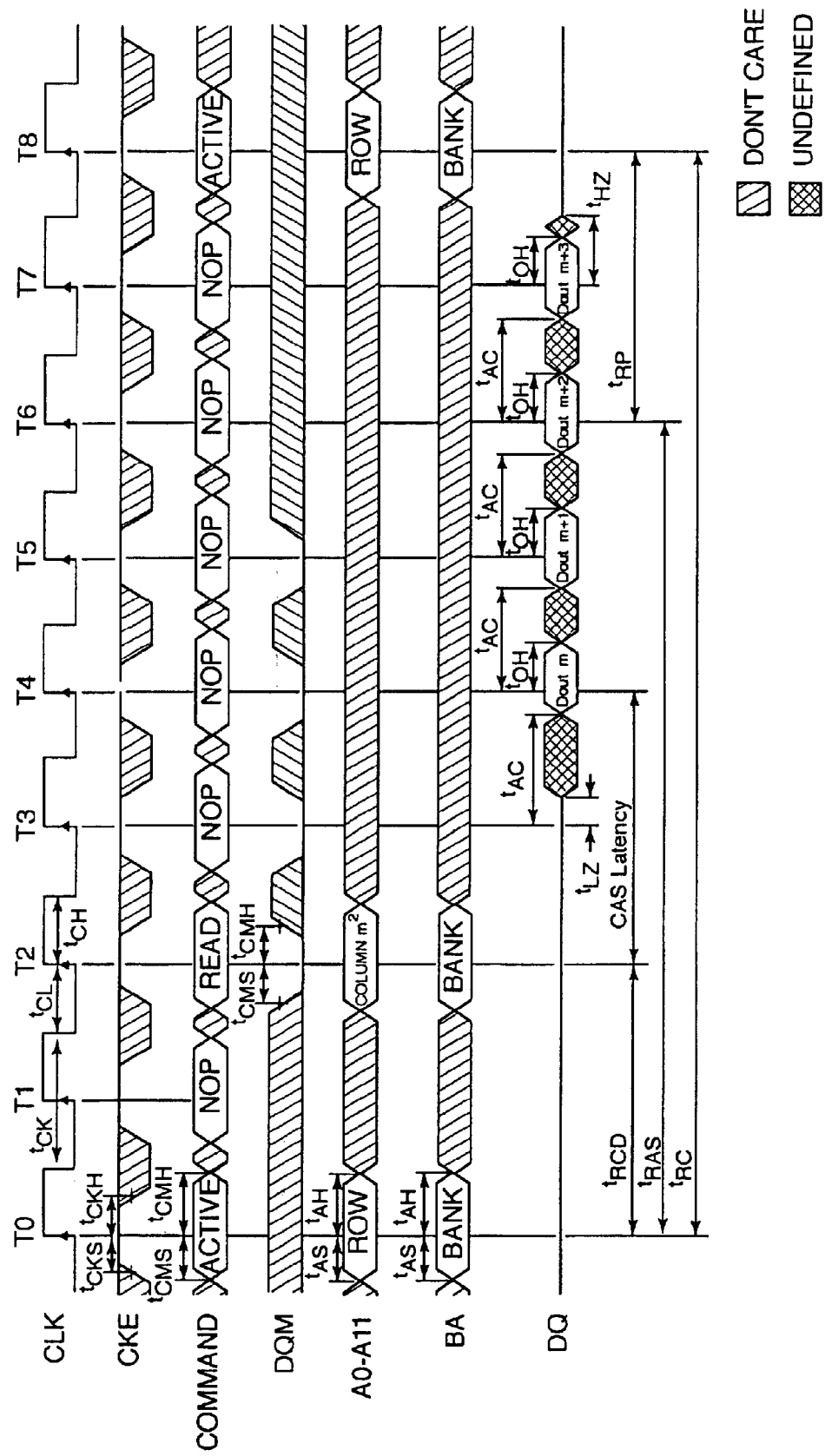
FIG. 26 illustrates the timing of a burst read operation.
Figure 27:
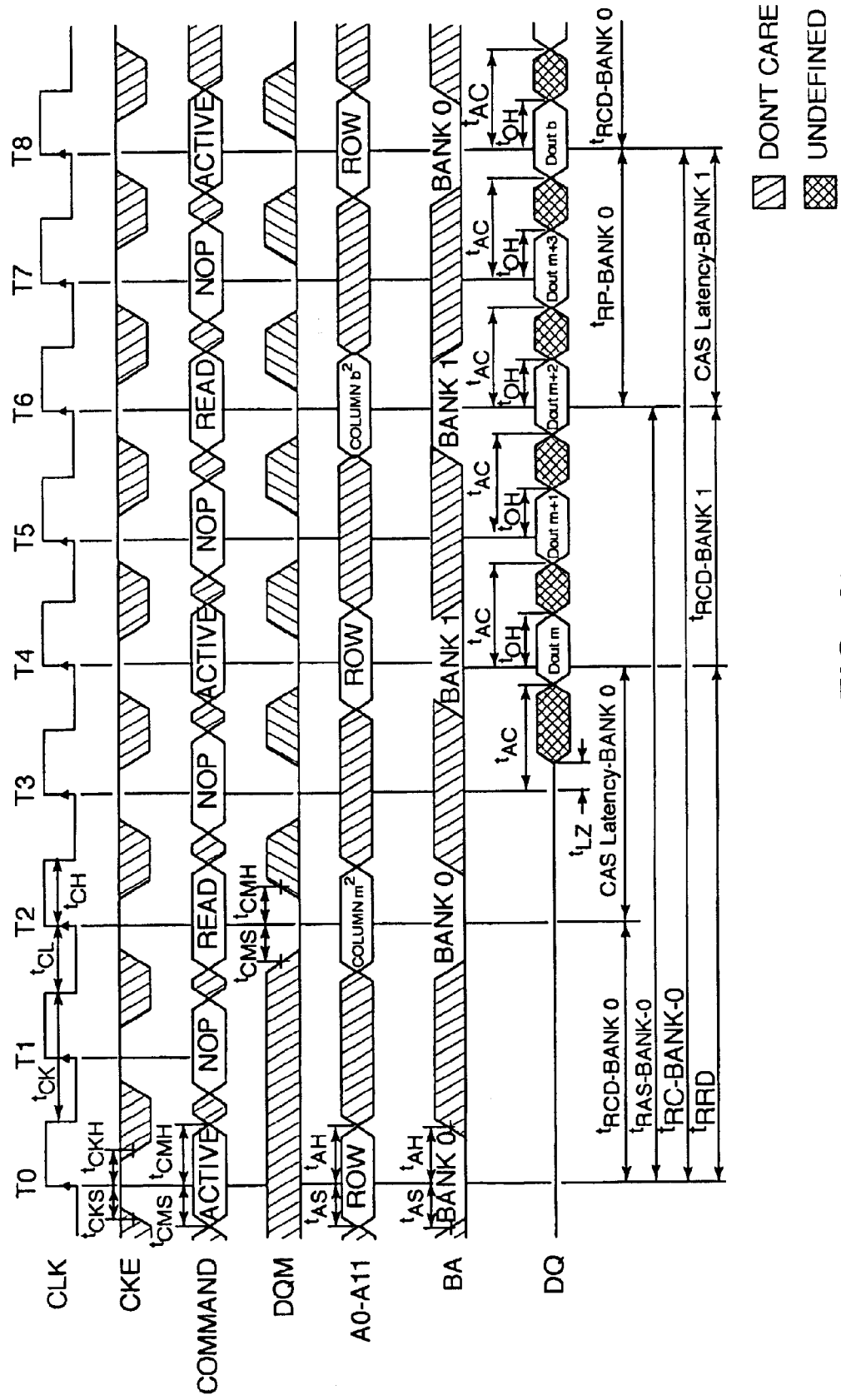
FIG. 27 illustrates the timing of alternating bank read accesses.
Figure 28:
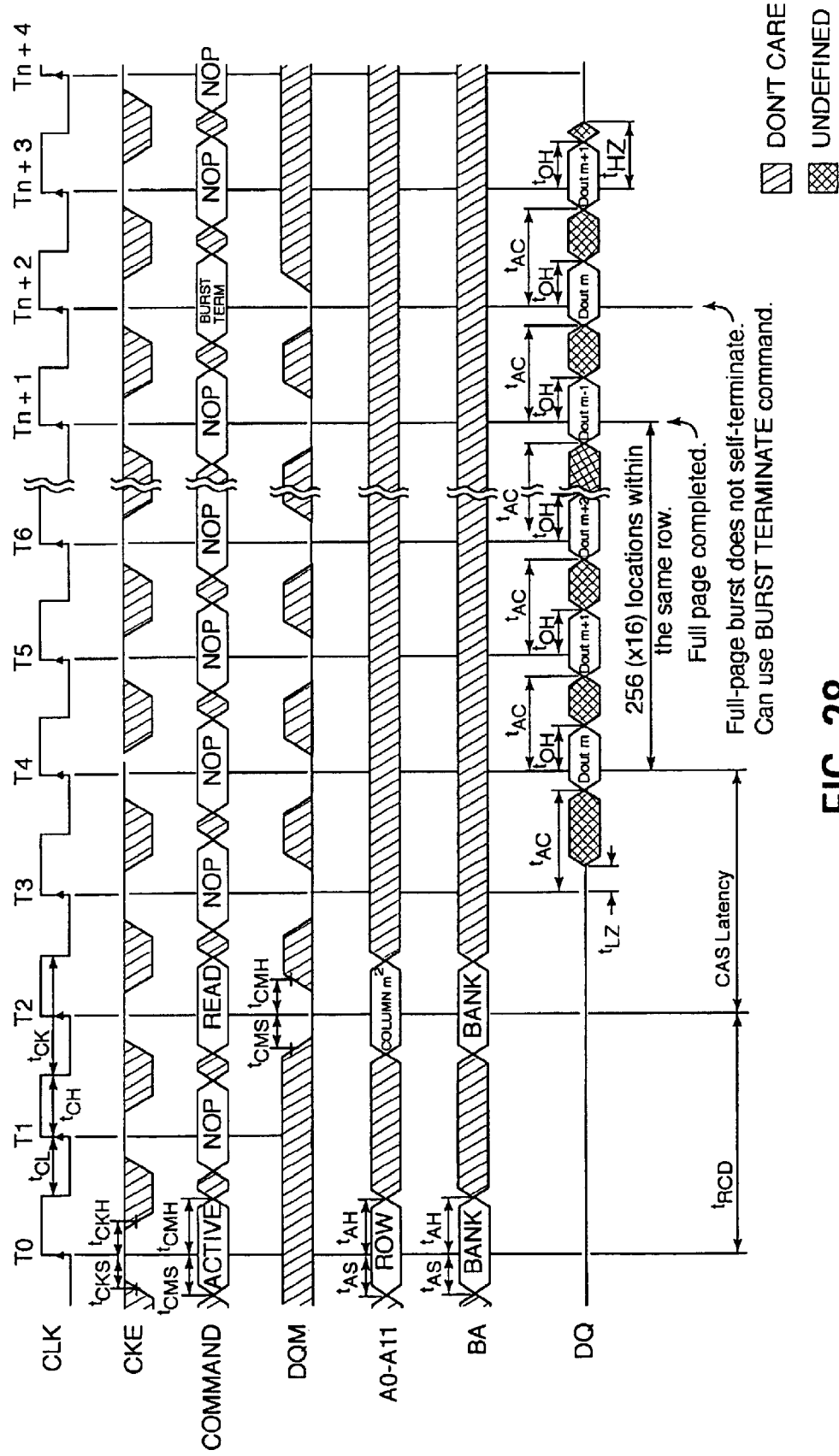
FIG. 28 illustrates the timing of a full-page burst read operation.

FIG. 25 illustrates the timing of a clock suspend mode operation, and FIG. 26 illustrates the timing of another burst read operation. FIG. 27 illustrates the timing of alternating bank read accesses. Here active commands are needed to change bank addresses. A full page burst read operation is illustrated in FIG. 28. Note that the full page burst does not self terminate, but requires a terminate command.

Figure 29:
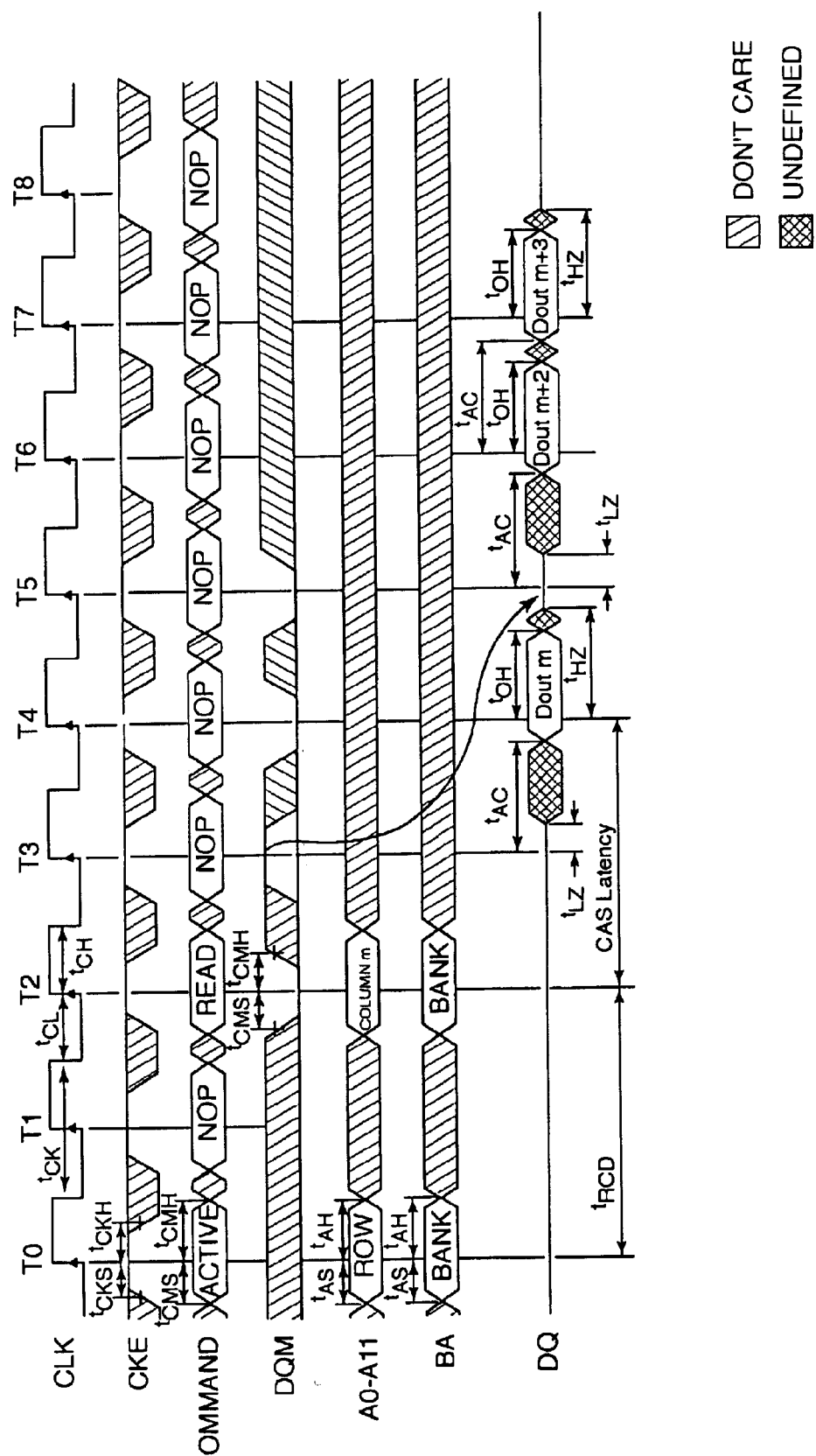
FIG. 29 illustrates the timing of a burst read operation using a data mask signal.

FIG. 29 illustrates the timing of a read operation using a data mask signal. The DQM signal is used to mask the data output so that Dout m+1 is not provided on the DQ connections.

Figure 30:
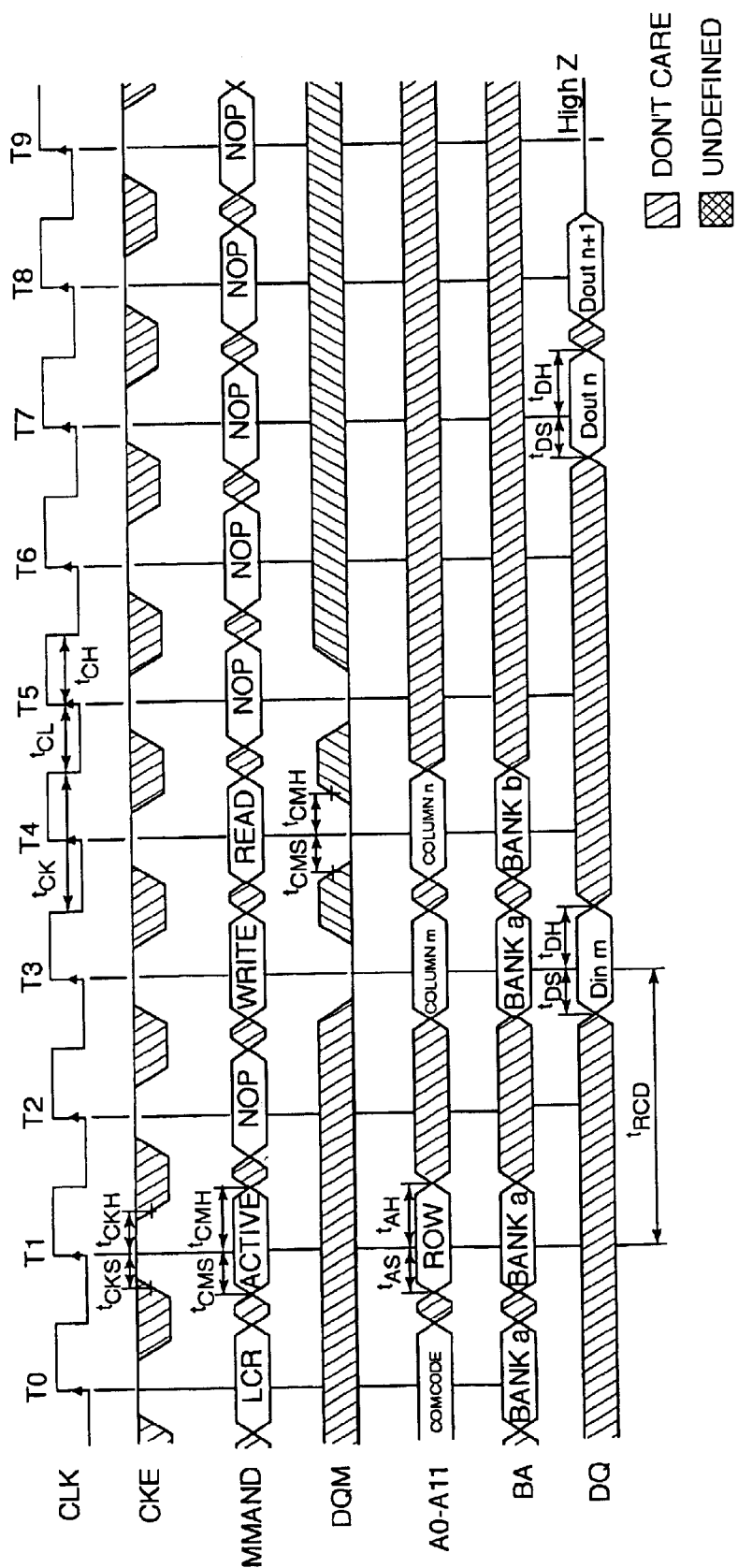
FIG. 30 illustrates the timing of a write operation followed by a read to a different bank.

Referring to FIG. 30, the timing of a write operation followed by a read to a different bank is illustrated. In this operation, a write is performed to bank a and a subsequent read is performed to bank b. The same row is accessed in each bank.

Figure 31:
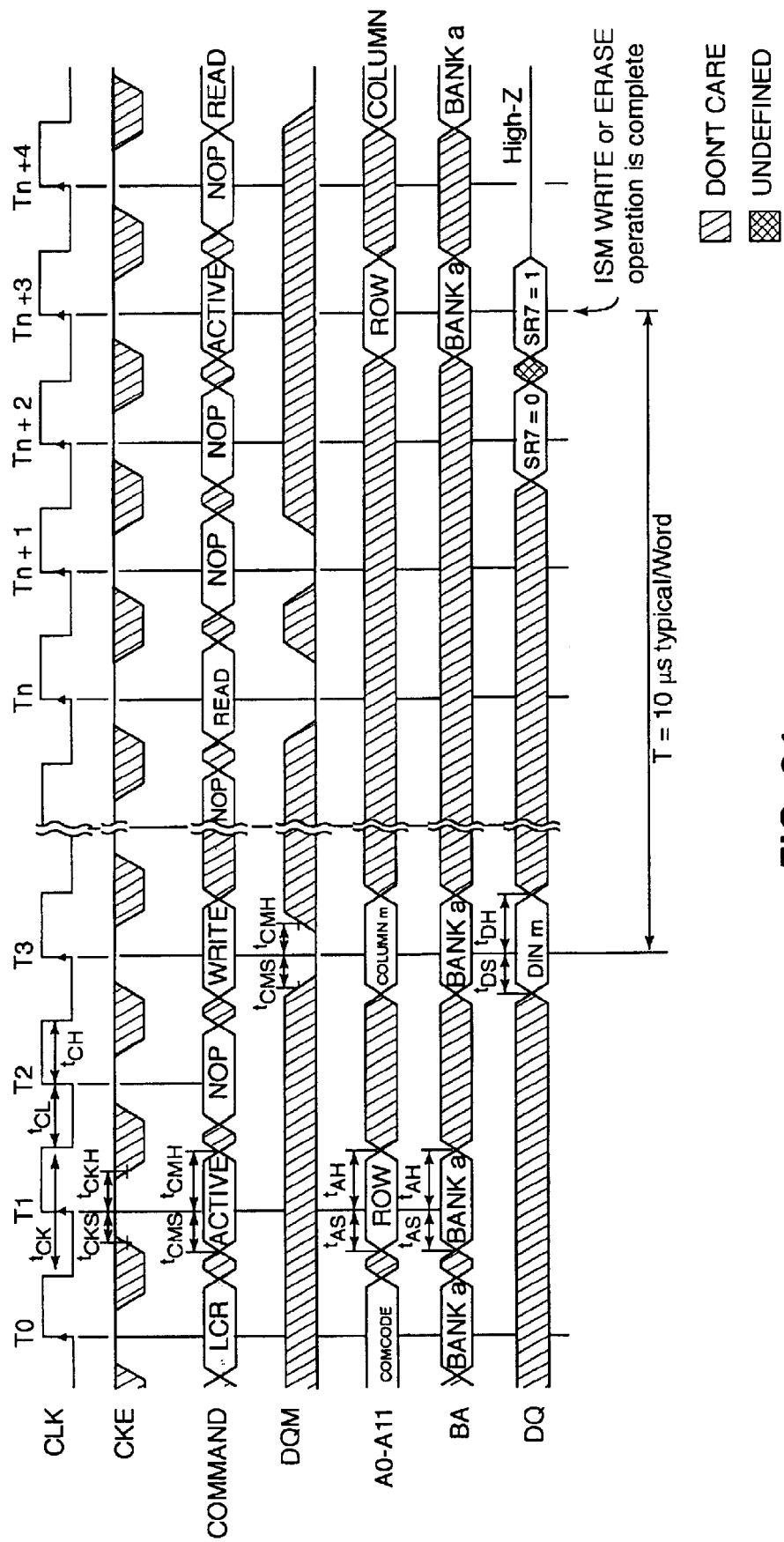
FIG. 31 illustrates the timing of a write operation followed by a read to the same bank.

Referring to FIG. 31, the timing of a write operation followed by a read to the same bank is illustrated. In this operation, a write is performed to bank a and a subsequent read is performed to bank a. A different row is accessed for the read operation, and the memory must wait for the prior write operation to be completed. This is different from the read of FIG. 30 where the read was not delayed due to the write operation.

Interface

As explained above, many processor/computer systems use a code that is stored on a hard disk, copied to the DRAM and executed from the DRAM. This is done because the speed and performance of the system is usually dictated by the performance of the DRAM. Most of today's systems use SDRAM because it is synchronous and runs at speeds exceeding 100 MHz.

The main reason for using DRAM rather than using prior Flash memories is based on cost and performance. The cost to the system is two fold. First, both Flash memories as well as DRAM would have to be purchased. Secondly, the system cannot put the Flash memory on the main memory bus since prior Flash memories do not work in the same manner as a DRAM, and DRAM controllers are not designed to handle the extra control inputs required for today's Flash memory devices. Transferring data from a hard disc to SDRAM takes time. This boot time is often very irritating to computer users.

The Flash memory described herein, however, uses the same interface as a DRAM for reading. This flash memory uses the same interconnect pins as a SDRAM and fits into the same package. There are a couple of pins used in the Flash memory for writing, such as a Vccp that is added to one of the not-connected, or no-connect, (NC) pins on a SDRAM package. The other pin is RP# which is used for resetting the Flash Memory chip, explained above. The RP# connection is also used on another NC pin on the SDRAM chip.

The Flash read obviously needs to have the same performance as a SDRAM chip. Current flash memories are running as fast as 10 to 50 MHz, which is much slower than the performance one gets out of SDRAM chips. The present invention provides the same performance as the SDRAM, and allows system designers to put this flash memory on the main memory bus. Thus, reducing the pin cost on their controller as well as avoiding the need to support another bus. Using a flash memory also eliminates the storage needs from which the SDRAM initially gets loaded up. In some systems it would be the hard disk, or if there were no hard disks on the system, it would reduce the cost by eliminating the need for a shadow SDRAM. Regarding performance, the present flash memory eliminates the time needed to upload the SDRAM at power up and allows for an instant turn on of the system.

In summary, the present invention provides a flash memory device that has the same interconnect pin configuration as a synchronous DRAM and fits into the same package. Two of the no-connect (NC) interconnect pins of the SDRAM package have been changed. One NC is replaced with an optional Vpp connection and a second NC has been replaced with a reset/power-down (RP#) interconnect.

Figure 32:
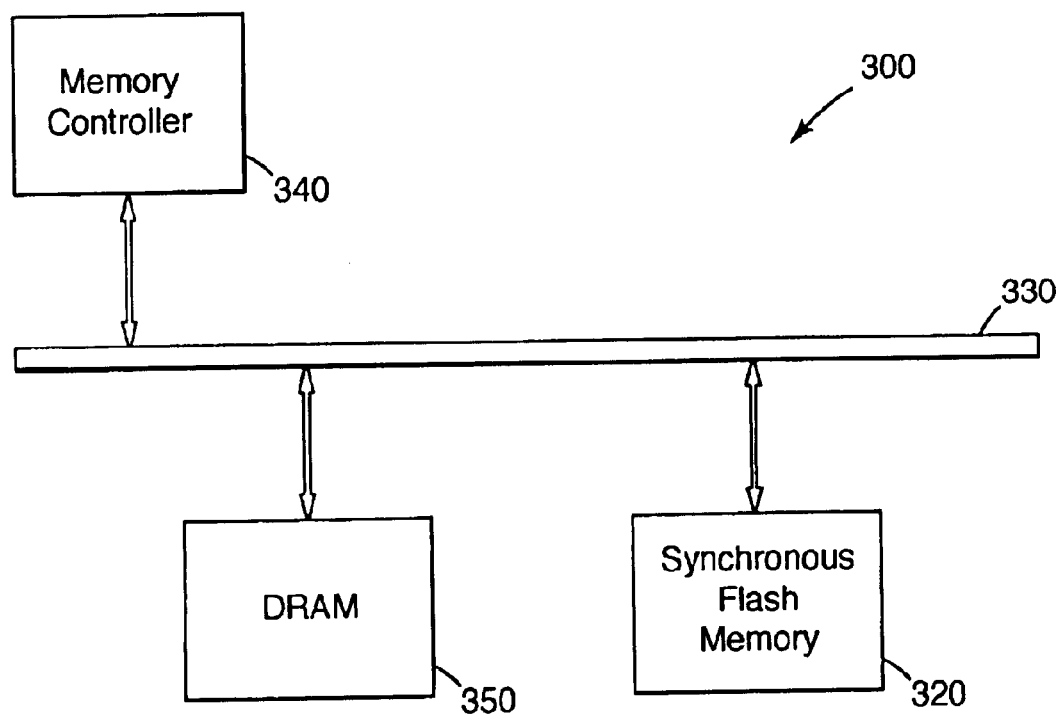
FIG. 32 illustrates a block diagram of a system according to one embodiment of the invention.

FIG. 32 illustrates a block diagram of a system 300 according to one embodiment of the invention. The system includes a synchronous flash memory 320 coupled to a memory controller 340 via a main memory bus 330. The main memory bus can also be coupled to a DRAM 350.

Conclusion

A computer system comprises a memory controller and a synchronous non-volatile memory device coupled to the memory controller via a main memory bus. The synchronous non-volatile memory device has external interconnects arranged in a manner that corresponds to interconnects of a synchronous dynamic random access memory device. The synchronous flash memory device, however, comprises a reset connection, and a Vccp power supply connection correspond to first and second no-connect (NC) interconnect pins of the synchronous dynamic random access memory. In one embodiment, the synchronous non-volatile memory device has a command interface comprising a write enable connection (WE#) to receive a write enable signal, a column address strobe connection (CAS#) to receive a column address strobe signal, a row address strobe connection (RAS#) to receive a row address strobe signal, and a chip select connection (CS#) to receive a chip select signal.

What is claimed is:

1. A synchronous flash memory device comprising:
   an array of non-volatile memory cells; and
   a plurality of external connections comprising,
      a plurality of bi-directional data connections,
      a plurality of memory address connections,
      a clock input connection,
      a write enable connection,
      a column address strobe connection,
      a row address strobe connection, and
      wherein the plurality of external connections are arranged in a pattern compatible with a synchronous dynamic random access memory (SDRAM).

2. The synchronous flash memory device of claim 1, wherein the plurality of external connections further comprises:
   a clock enable connection,
   a chip select connection,
   a plurality of memory array bank address connections,
   power supply connections,
   a plurality of data mask connections, and
   a reset connection.

3. The synchronous flash memory device of claim 1, wherein the plurality of external connections further comprises a Vccp power supply connection.

4. The synchronous flash memory device of claim 1, further comprising a package having a plurality of interconnect pins corresponding to the external connections.

5. The synchronous flash memory device of claim 1, further comprising a package having a plurality of conductive interconnect locations corresponding to the external connections.

6. The synchronous flash memory device of claim 1, wherein the synchronous flash memory device operates within read timing specification parameters for an SDRAM.

7. A synchronous flash memory device comprising:
   an array of non-volatile memory cells; and
   a package having a plurality of interconnect pins arranged in a manner that corresponds to interconnect pins of a synchronous dynamic random access memory device, wherein the plurality of interconnect pins of the synchronous flash memory device comprises a reset connection, and a Vccp power supply connection correspond to first and second no-connect (NC) interconnect pins of the synchronous dynamic random access memory.

8. The synchronous flash memory device of claim 7, wherein the plurality of interconnect pins comprises:
a plurality of bi-directional data connections,
a plurality of memory address connections,
a write enable connection,
a clock input connection,
a column address strobe connection,
a row address strobe connection, and
power supply connections.

9. The synchronous flash memory device of claim 8, wherein the plurality of interconnect pins further comprises:
a clock enable connection,
a chip select connection,
a plurality of memory array bank address connections,
a plurality of data mask connections,
a reset connection, and
a Vccp power supply connection.

10. A synchronous flash memory device comprising:
an array of non-volatile memory cells; and
a package having a plurality of solder bump connections arranged in a manner that corresponds to solder bump connections of a synchronous dynamic random access memory device, wherein the plurality of solder bump connections of the synchronous flash memory device comprises a reset connection, and a Vccp power supply connection correspond to first and second no-connect (NC) solder bump connections of the synchronous dynamic random access memory.

11. The synchronous flash memory device of claim 10, wherein the plurality of solder bump connections comprises:
a plurality of bi-directional data connections,
a plurality of memory address connections,
a write enable connection,
a clock input connection,
a column address strobe connection,
a row address strobe connection, and
power supply connections.

12. The synchronous flash memory device of claim 11, wherein the plurality of interconnect pins further comprises:
a clock enable connection,
a chip select connection,
a plurality of memory array bank address connections,
a plurality of data mask connections,
a reset connection, and
a Vccp power supply connection.

13. A synchronous flash memory device having an interface comprising:
a clock input connection (CLK) to receive a clock signal;
a write enable connection (WE#) to receive a write enable signal;
a column address strobe connection (CAS#) to receive a column address strobe signal;
a row address strobe connection (RAS#) to receive a row address strobe signal;
a chip select connection (CS#) to receive a chip select signal;
a reset connection (RP#) to receive a reset signal;
a Vccp power supply connection to receive an elevated power supply signal; and
a plurality of external connections, wherein the plurality of external connections are arranged in a pattern compatible with a synchronous dynamic random access memory (SDRAM).

14. The synchronous flash memory device of claim 13, wherein the interface further comprises:
a plurality of bi-directional data connections (DQ);
a plurality of memory address connections;
a clock enable connection (CKE);
a plurality of memory array bank address connections (BA#);
power supply connections (Vcc and Vss); and
a plurality of data mask connections (DQM).

15. The synchronous flash memory device of claim 14, further comprising a package having a plurality of interconnect pins corresponding to the command interface connections.

16. The synchronous flash memory device of claim 14, further comprising a package having a plurality of conductive interconnect locations corresponding to the command interface connections.

17. A computer system comprising:
a memory controller;
a main memory bus coupled to the memory controller, and
a synchronous non-volatile flash memory device coupled to the main memory bus,
wherein the synchronous non-volatile flash memory device has a plurality of external connections are arranged in a pattern compatible with a synchronous dynamic random access memory (SDRAM) and a command interface comprising:
a write enable connection (WE#) to receive a write enable signal;
a column address strobe connection (CAS#) to receive a column address strobe signal;
a row address strobe connection (RAS#) to receive a row address strobe signal; and
a chip select connection (CS#) to receive a chip select signal.

18. The computer system of claim 17, wherein the synchronous non-volatile flash memory device comprises a package having a plurality of interconnect pins arranged in a manner that corresponds to interconnect pins of a synchronous dynamic random access memory device, wherein the plurality of interconnect pins of the synchronous flash memory device comprises a reset connection, and a Vccp power supply connection correspond to first and second no-connect (NC) interconnect pins of the synchronous dynamic random access memory.

19. The computer system of claim 17, wherein the synchronous non-volatile flash memory device comprises a package having a plurality of solder bump connections arranged in a manner that corresponds to solder bump connections of a synchronous dynamic random access memory device, wherein the plurality of solder bump connections of the synchronous flash memory device comprises a reset connection, and a Vccp power supply connection correspond to first and second no-connect (NC) solder bump connections of the synchronous dynamic random access memory.

20. The computer system of claim 17, wherein the plurality of external connections comprise:
- a plurality of bi-directional data connections;
- a plurality of memory address connections;
- a clock input connection;
- a clock enable connection;
- a plurality of memory array bank address connections;
- power supply connections;
- a plurality of data mask connections;
- a reset connection; and
- a Vccp power supply connection.

* * * * *

UNITED STATES PATENT AND TRADEMARK OFFICE
CERTIFICATE OF CORRECTION

| | | |
|---|---|---|
| PATENT NO. | : 6,892,270 B2 | Page 1 of 1 |
| APPLICATION NO. | : 10/786353 | |
| DATED | : May 10, 2005 | |
| INVENTOR(S) | : Frankie F. Roohparvar | |

It is certified that error appears in the above-identified patent and that said Letters Patent is hereby corrected as shown below:

Column 1,
Line 46, replace "modem" with --modern--

Column 8,
Line 18, in Table 1, replace "5-6-7-0-1-0-3-2" with -- 5-6-7-0-1-2-3-4 --

Signed and Sealed this

Nineteenth Day of September, 2006

JON W. DUDAS
*Director of the United States Patent and Trademark Office*